US012672531B2

(12) United States Patent　　(10) Patent No.:　US 12,672,531 B2

Li et al.　　(45) Date of Patent:　Jun. 30, 2026

(54) TRANSISTORS WITH VIA-TO-BACKSIDE POWER RAIL SPACERS

(71) Applicant: International Business Machines Corporation, Armonk, NY (US)

(72) Inventors: Tao Li, Slingerlands, NY (US); Liqiao Qin, Albany, NY (US); Devika Sarkar Grant, Amsterdam, NY (US); Nikhil Jain, Apple Valley, MN (US); Prabudhya Roy Chowdhury, Albany, NY (US); Sagarika Mukesh, Albany, NY (US); Kisik Choi, Watervliet, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 17/950,361

(22) Filed: Sep. 22, 2022

(65) Prior Publication Data

US 2024/0105554 A1　　Mar. 28, 2024

(51) Int. Cl.
　　*H01L 23/48*　　(2006.01)
　　*H01L 29/08*　　(2006.01)
　　*H01L 29/66*　　(2006.01)
　　*H10D 62/13*　　(2025.01)
　　(Continued)

(52) U.S. Cl.
　　CPC .......... *H10W 20/20* (2026.01); *H10D 62/151* (2025.01); *H10D 64/021* (2025.01)

(58) Field of Classification Search
　　CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/797; H10D 62/021; H10D 62/118; H10D 62/119; H10D 62/121; H10D 62/149; H10D 62/151; H10D 64/015; H10D 64/018; H10D 64/021; H10D 84/013; H10D 84/0158; H10D 84/017; H10D 84/0193; H10D 84/834; H10D 84/853; H01L 21/76897; H01L 21/76898; H01L 23/481; H01L 23/5226; H01L 23/528; H01L 23/5283; H01L 23/5286; H01L 23/535

See application file for complete search history.

(56) References Cited

U.S. PATENT DOCUMENTS

| 9,570,395 B1 | 2/2017 | Sengupta et al. |
| 10,276,499 B2 | 4/2019 | Peng et al. |
| 10,347,543 B2 | 7/2019 | Baars et al. |
| (Continued) | | |

OTHER PUBLICATIONS

A. Gupta et al., "Buried Power Rail Integration with Si FinFETs for CMOS Scaling beyond the 5 nm Node," 2020 IEEE Symposium on VLSI Technology, Jun. 16-19, 2020, 2 pages.

(Continued)

*Primary Examiner* — David C Spalla

(74) *Attorney, Agent, or Firm* — L. Jeffrey Kelly; Ryan, Mason & Lewis, LLP

(57)　　ABSTRACT

A semiconductor structure includes a source/drain region; a frontside source/drain contact disposed on the source/drain region, a via-to-backside power rail disposed on the frontside source/drain contact and on a portion of the source/drain region, and a backside power rail connected to the via-to-backside power rail.

20 Claims, 25 Drawing Sheets

(51) Int. Cl.
    *H10D 64/01*        (2025.01)
    *H10W 20/20*        (2026.01)

(56)                    References Cited

U.S. PATENT DOCUMENTS

| | | | | |
|---|---|---|---|---|
| 10,586,765 | B2 * | 3/2020 | Smith | .............. H01L 21/76895 |
| 10,636,739 | B2 | 4/2020 | Beyne et al. | |
| 10,700,207 | B2 | 6/2020 | Chen et al. | |
| 10,770,479 | B2 * | 9/2020 | Smith | .................. H01L 21/743 |
| 11,721,628 | B2 * | 8/2023 | Kim | .................. H10D 84/0149 |
| | | | | 257/382 |
| 2020/0105671 | A1 | 4/2020 | Lai et al. | |
| 2021/0118798 | A1 | 4/2021 | Liebmann et al. | |
| 2021/0202500 | A1 | 7/2021 | Chanemougame et al. | |
| 2021/0305252 | A1 | 9/2021 | Chiang et al. | |
| 2021/0343645 | A1 | 11/2021 | Peng et al. | |

OTHER PUBLICATIONS

D. Prasad et al., "Buried Power Rails and Back-side Power Grids:
Arm CPU Power Delivery Network Design Beyond 5nm," 2019
IEEE International Electron Devices Meeting (IEDM), Dec. 7-11,
2019, pp. 19.1.1-19.1.4.

* cited by examiner

TRANSISTORS WITH VIA-TO-BACKSIDE POWER RAIL SPACERS

BACKGROUND

A field-effect transistor (FET) is a transistor having a source, a gate, and a drain, the operation of which depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

SUMMARY

Illustrative embodiments of the present application include techniques for use in semiconductor manufacture. In an illustrative embodiment, a semiconductor structure comprises a source/drain region, a frontside source/drain contact disposed on the source/drain region, a via-to-backside power rail disposed on the frontside source/drain contact and on a portion of the source/drain region, and a backside power rail connected to the via-to-backside power rail.

In another illustrative embodiment, a semiconductor structure comprises a first gate structure, a second gate structure, a sidewall spacer disposed on a portion of sidewalls of the first gate structure and the second gate structure, a dielectric spacer disposed on the remaining portion of the sidewalls of the first gate structure and the second gate structure, and a via-to-backside power rail disposed between the first gate structure and the second gate structure. The via-to-backside power rail has a lower portion separated from the first gate structure and the second gate structure by the sidewall spacers and an upper portion separated from the first gate structure and the second gate structure by the dielectric spacer.

In yet another illustrative embodiment, a semiconductor structure comprises a first source/drain region, a second source/drain region, a first frontside source/drain contact disposed on the first source/drain region, a second frontside source/drain contact disposed on the second source/drain region, a via-to-backside power rail disposed on the frontside source/drain contact and on a portion of the source/drain region, and a backside power rail connected to the via-to-backside power rail.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figures 1A, 1B:
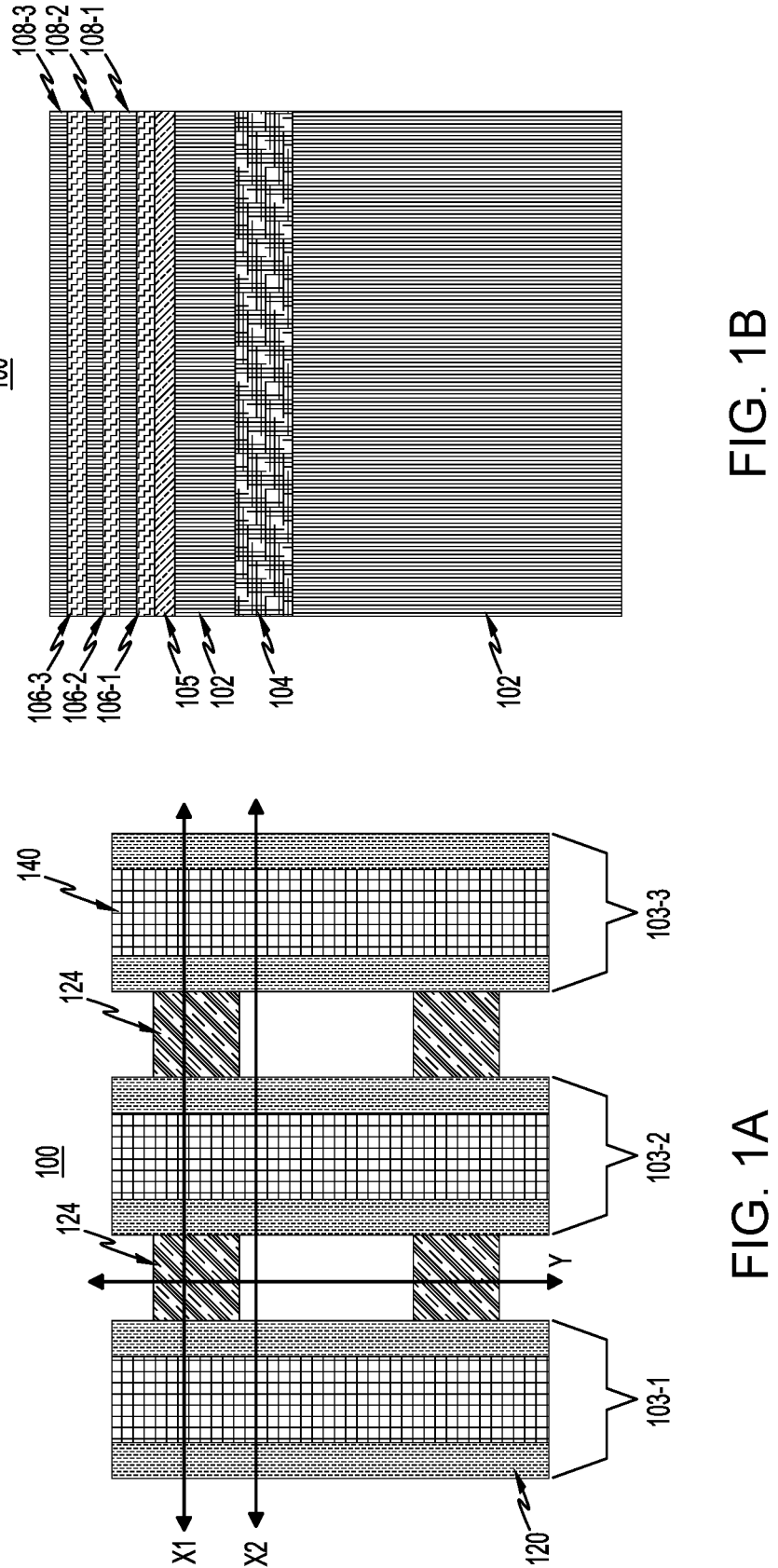
FIG. 1A is a top view illustrating a semiconductor structure for use at a first-intermediate fabrication stage, according to an illustrative embodiment.
FIG. 1B is a cross-sectional view of the semiconductor structure taken along the X1-X1 axis of FIG. 1A at the first-intermediate fabrication stage, according to an illustrative embodiment.

Illustrative embodiments of the invention may be described herein in the context of illustrative methods for forming a semiconductor structure having spacers separating a via-to-backside power rail from a gate to prevent shorting, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Figure 1C:
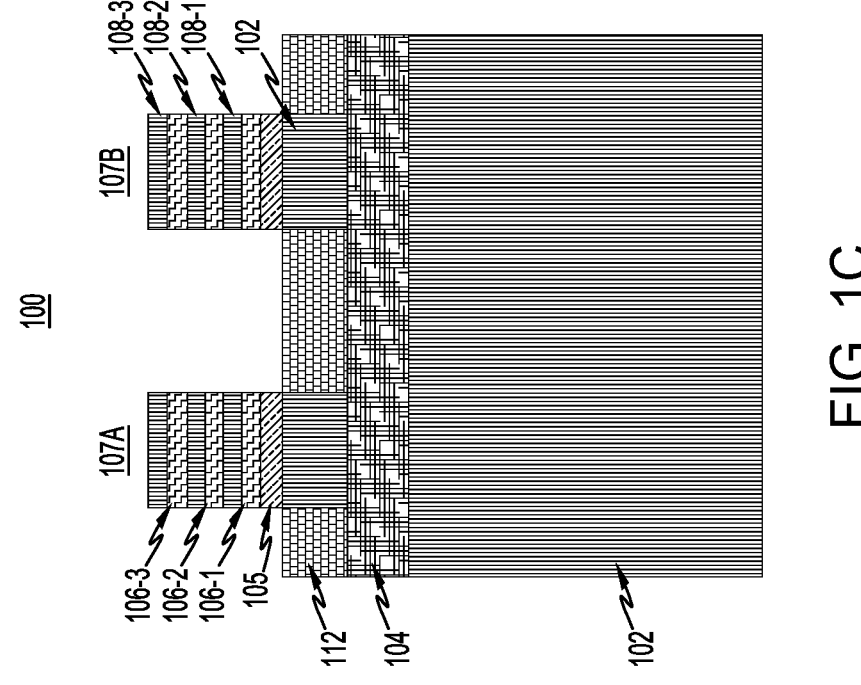
FIG. 1C is a cross-sectional view of the semiconductor structure taken along the Y-Y axis of FIG. 1A at the first-intermediate fabrication stage, according to an illustrative embodiment.

Present semiconductor processing forms a via-to-backside power rail that is highly susceptible to gate short. Illustrative embodiments provide methods and structures for overcoming the foregoing drawback by first forming a via-to-backside power rail between gate structures, removing a portion of sidewall spacers in the via-to-backside power rail and depositing a dielectric spacer that is aligned with the remaining sidewall spacer. Referring now to FIGS. 1A-1C, FIG. 1A shows a top-down view of a semiconductor structure 100 where gate structures 103-1, 103-2 and 103-3 will be formed as well as bottom source/drain regions 124. The first side cross-sectional view of FIG. 1B is taken along the line X1-X1 in the top-down view of FIG. 1A (e.g., across the gate structures 103-1, 103-2 and 103-3), and the second side cross-sectional view of FIG. 1C is taken along the line Y-Y in the top-down view of FIG. 1A (e.g., across the fins).

FIGS. 1A-1B show semiconductor structure 100. Semiconductor structure 100 includes substrate 102. Substrate 102 may be formed of any suitable semiconductor material, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

An etch stop layer 104 is formed in the substrate 102. The etch stop layer 104 may comprise a buried oxide (BOX) layer or silicon germanium (SiGe), or another suitable material such as a III-V semiconductor epitaxial layer.

Nanosheets are initially formed over the substrate 102, where the nanosheets include sacrificial layer 105, sacrificial layers 106-1, 106-2 and 106-3 (collectively, sacrificial layers 106), and nanosheet channel layers 108-1, 108-2 and 108-3 (collectively, nanosheet channel layers 108). The sacrificial layers 105 and 106 are illustratively formed of different sacrificial materials, such that they may be etched or otherwise removed selective to one another. In some embodiments, the sacrificial layers are formed of SiGe, but with different percentages of Ge. For example, certain ones of the sacrificial layers may have a relatively higher percentage of Ge (e.g., 55% Ge), and other ones of the sacrificial layers may have a relatively lower percentage of Ge (e.g., 25% Ge). Other combinations of different sacrificial materials may be used in other embodiments. The nanosheet channel layers 108 may be formed of Si or another suitable material (e.g., a material similar to that used for the substrate 102).

The nanosheets are then patterned for formation of STI regions 112 and FET stacks 107A and 107B as shown in FIG. 1C. The STI regions 112 may be formed of a dielectric material such as silicon dioxide (SiO$_2$), silicon oxycarbide (SiOC), silicon oxynitride (SiON), etc. Each of FET stacks 107A and 107B contain a FET device. The FET devices may comprise an nFET device or a pFET device and other FET device may comprise a pFET device or an nFET device.

Figure 2A:
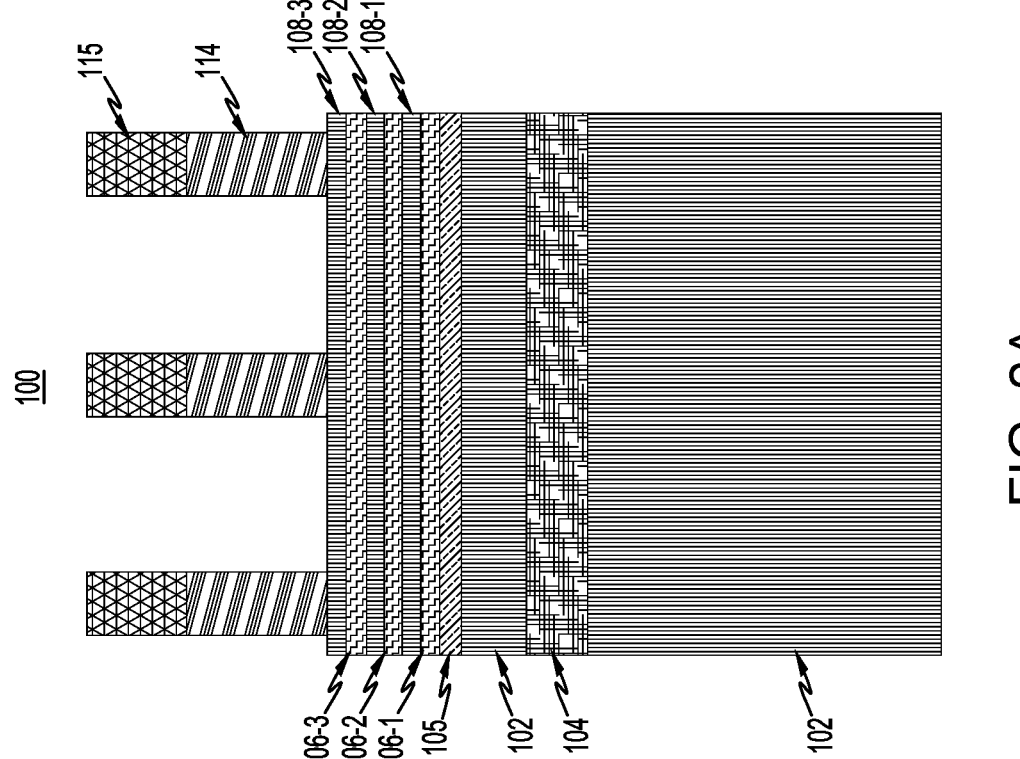
FIG. 2A is a cross-sectional view of the semiconductor structure taken along the X1-X1 axis of FIG. 1A at a second-intermediate fabrication stage, according to an illustrative embodiment.
Figure 2C:
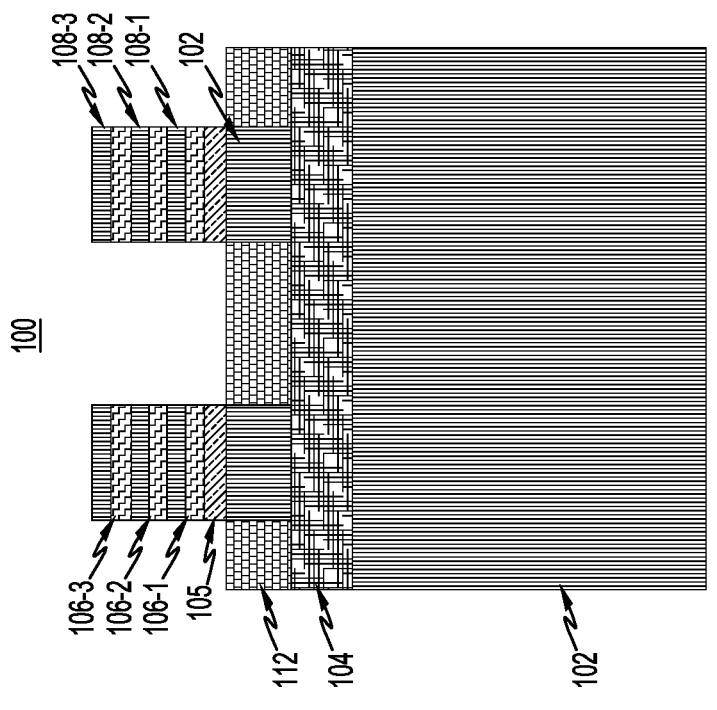
FIG. 2C is a cross-sectional view of the semiconductor structure taken along the Y-Y axis of FIG. 1A at the second-intermediate fabrication stage, according to an illustrative embodiment.
Figure 2B:
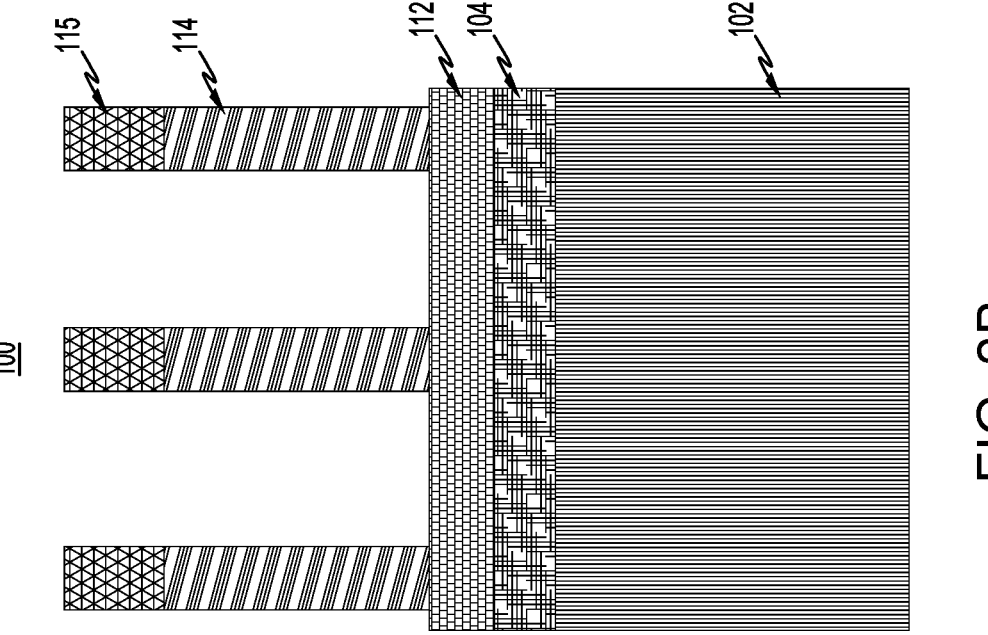
FIG. 2B is a cross-sectional view of the semiconductor structure taken along the X2-X2 axis of FIG. 1A at the second-intermediate fabrication stage, according to an illustrative embodiment.

FIGS. 2A-2C illustrate semiconductor structure 100 at a second-intermediate fabrication stage. During this stage, dummy gate layer 114 may be filled over the structure, followed by patterning using a gate hard mask (HM) layer 115. The dummy gate layer 114 may be formed by blanket deposition of a dummy gate material (e.g., amorphous silicon (a-Si) or amorphous silicon germanium (a-SiGe) over a thin SiO$_2$ or titanium nitride (TiN) layer, or another suitable material) and material of the gate HM layer 115 (e.g., silicon nitride (SiN), a multi-layer of SiN and SiO$_2$, or another suitable material), followed by lithographic processing to result in the patterned gate HM layer 115 and underlying dummy gate layer 114 as shown in FIGS. 2A and 2B.

Figure 3B:
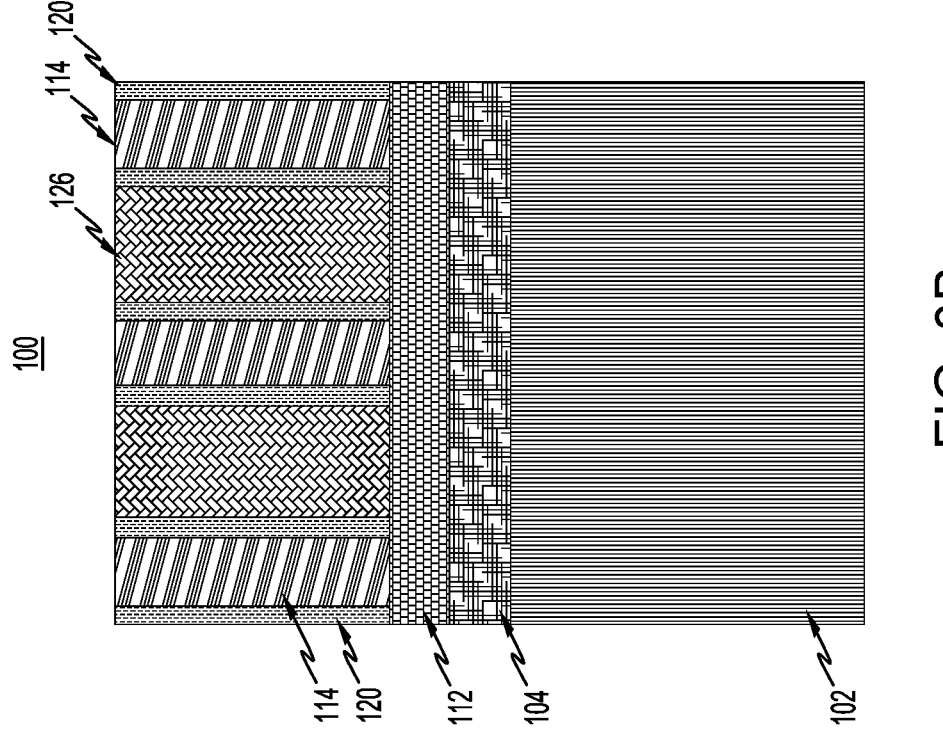
FIG. 3B is a cross-sectional view of the semiconductor structure taken along the X2-X2 axis of FIG. 1A at the third-intermediate fabrication stage, according to an illustrative embodiment.
Figure 3A:
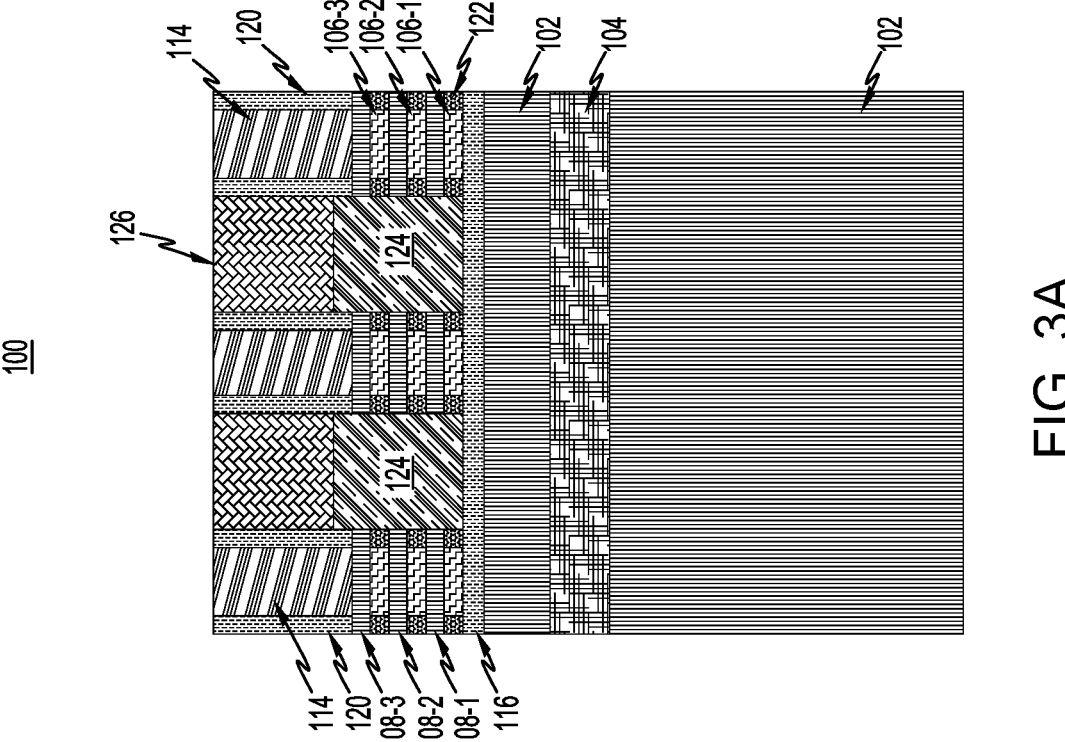
FIG. 3A is a cross-sectional view illustrating the semiconductor structure taken along the X1-X1 axis of FIG. 1A at a third-intermediate fabrication stage, according to an illustrative embodiment.
Figure 3C:
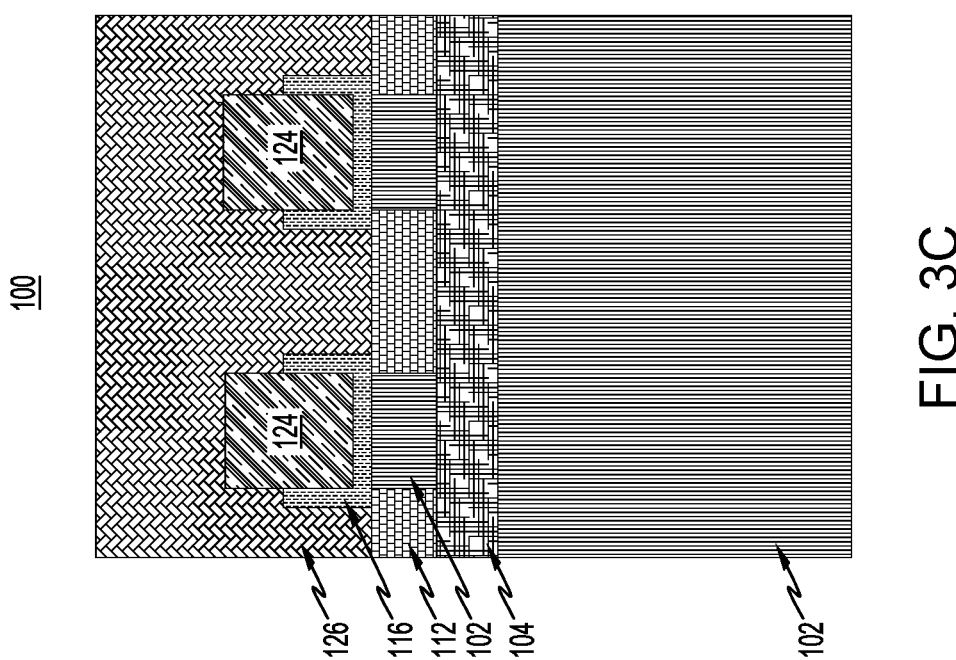
FIG. 3C is a cross-sectional view illustrating the semiconductor structure taken along the Y-Y axis of FIG. 1A at the third-intermediate fabrication stage, according to an illustrative embodiment.

FIGS. 3A-3C illustrate semiconductor structure 100 at a third-intermediate fabrication stage. During this stage, a bottom dielectric insulator (BDI) layer 116, sidewall spacers 120, inner spacers 122, bottom source/drain regions 124 and an interlayer dielectric (ILD) layer 126 are formed. To form the structure shown in FIGS. 3A-3C, sacrificial layer 105 is selectively removed. Next sidewall spacers 120 and BDI layer 116 are formed by conformal dielectric liner deposition and anisotropic dielectric liner etching, followed by indentation of the sacrificial layers 106-1, 106-2 and 106-3 and formation of inner spacer 122.

The BDI layer 116 may be formed of any suitable insulator, such as SiN, silicon boron carbide nitride (SiBCN), silicon oxycarbonitride (SiOCN), etc. The BDI layer 116 is formed in the region previously occupied by sacrificial layer 105.

The sidewall spacers 120 may be formed of materials similar to that of the BDI layer 116.

The inner spacers 122 may be formed to fill indent spaces (e.g., resulting from indent etches of the sacrificial layers prior to their removal). The inner spacers 122 may be formed of silicon nitride (SiN) or another suitable material such as SiBCN, silicon carbide oxide (SiCO), SiOCN, etc.

The bottom source/drain regions 124, as noted above, may be formed using epitaxial growth processes. The bottom source/drain regions 124 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride (BF$_2$), gallium (Ga), indium (In), and thallium (Tl). The bottom source/drain regions 124 may be formed using epitaxial growth processes. In some embodiments, the epitaxy process comprises in-situ doping (dopants are incorporated in epitaxy material during epitaxy).

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1 \times 10^{19}$ cm$^{-3}$ to $3 \times 10^{21}$ cm$^{-3}$, or preferably between $2 \times 10^{20}$ cm$^{-3}$ to $3 \times 10^{21}$ cm$^{-3}$.

The ILD layer 126 is formed between the bottom source/drain regions 124 and the sidewall spacers 120. The ILD layer 126 may be formed of any suitable isolating material, such as SiO$_2$, SiOC, SiON, etc.

Figure 4A:
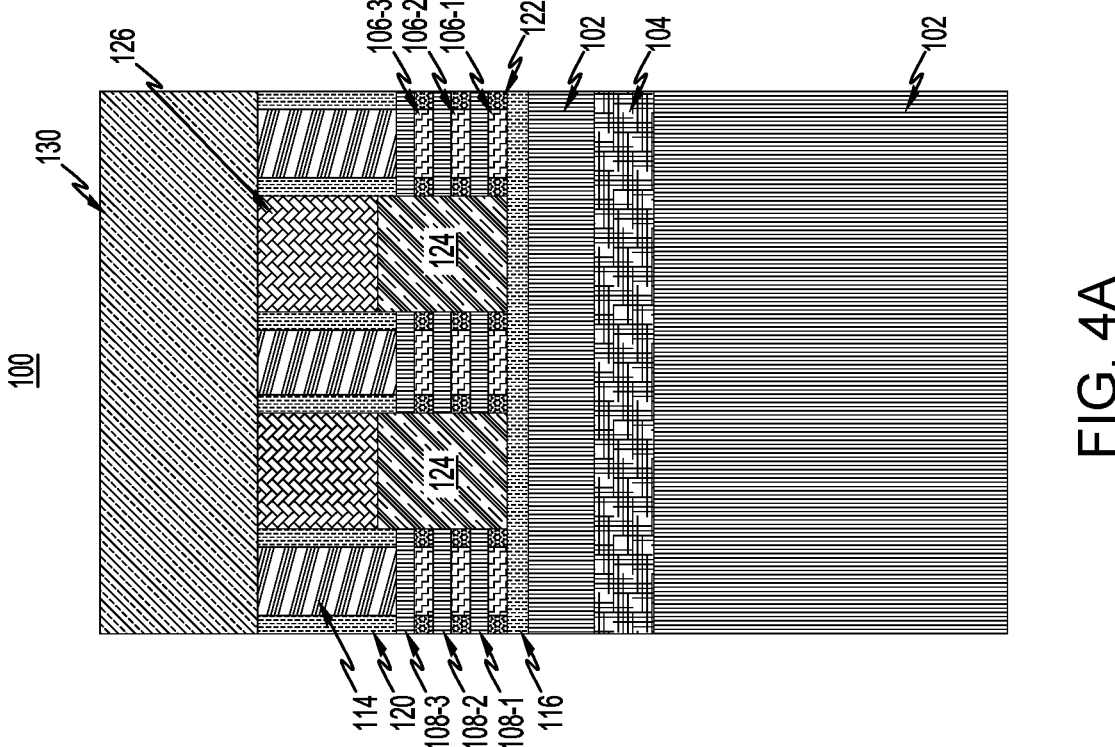
FIG. 4A is a cross-sectional view illustrating the semiconductor structure taken along the X1-X1 axis of FIG. 1A at a fourth-intermediate fabrication stage, according to an illustrative embodiment.
Figure 4C:
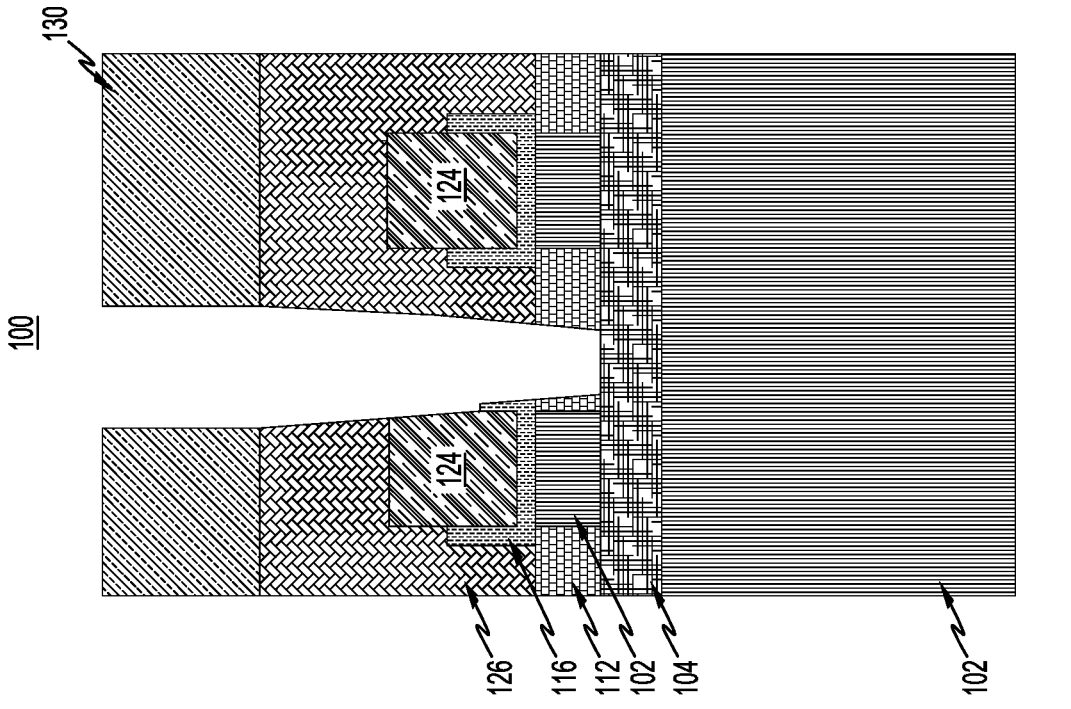
FIG. 4C is a cross-sectional view illustrating the semiconductor structure taken along the Y-Y axis of FIG. 1A at the fourth-intermediate fabrication stage, according to an illustrative embodiment.
Figure 4B:
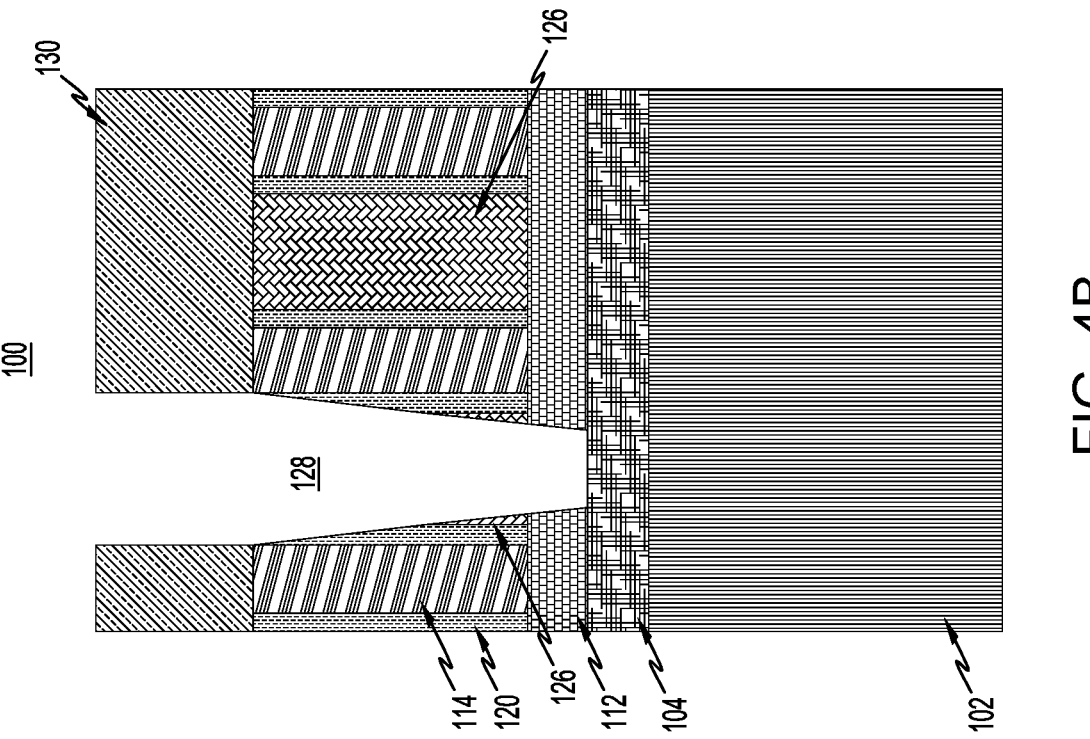
FIG. 4B is a cross-sectional view of the semiconductor structure taken along the X2-X2 axis of FIG. 1A at the fourth-intermediate fabrication stage, according to an illustrative embodiment.

FIGS. 4A-4C illustrate semiconductor structure 100 at a fourth-intermediate fabrication stage. During this stage, via-to-backside power rail (VBPR) trench 128 is formed by first depositing an organic planarization layer (OPL) 130 on semiconductor structure 100 using any conventional deposition process such as physical vapor deposition (PVD), atomic layer deposition (ALD), and chemical vapor deposition (CVD). OPL 130 can be composed of a flowable organic material such as, for example, a spin-on-carbon (SOC). Next, the OPL 130 is patterned and then selectively etched to remove portions of OPL 130, ILD layer 126, sidewall spacer 120, and STI region 112 by, for example, reactive-ion etching (ME) or other suitable etch processing to form VBPR trench 128.

Figure 5B:
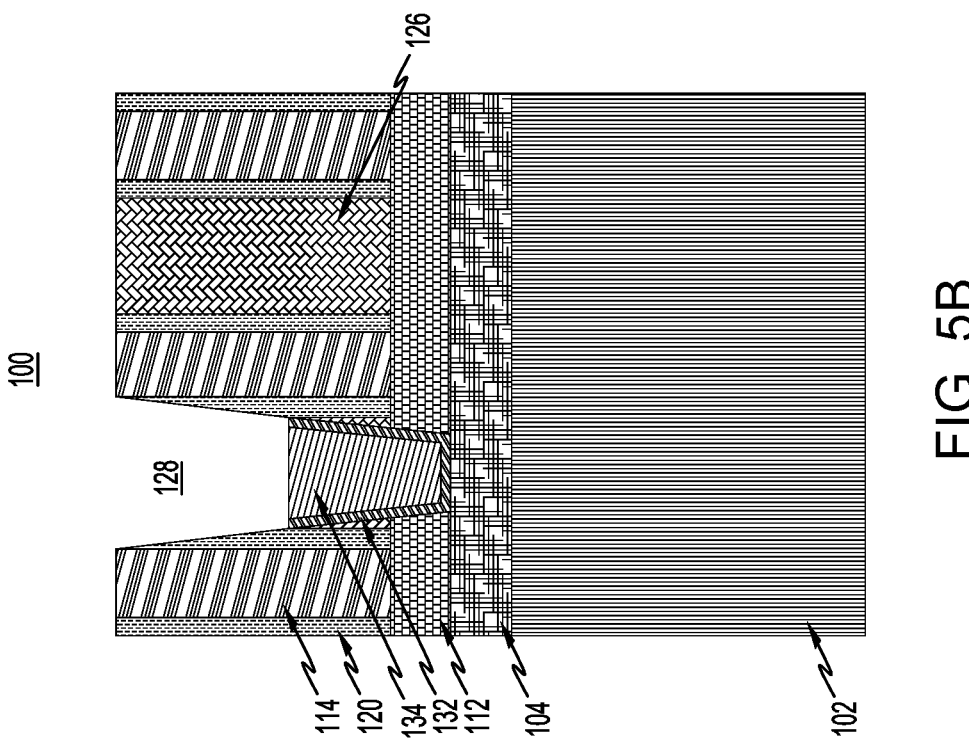
FIG. 5B is a cross-sectional view of the semiconductor structure taken along the X2-X2 axis of FIG. 1A at the fifth-intermediate fabrication stage, according to an illustrative embodiment.
Figure 5A:
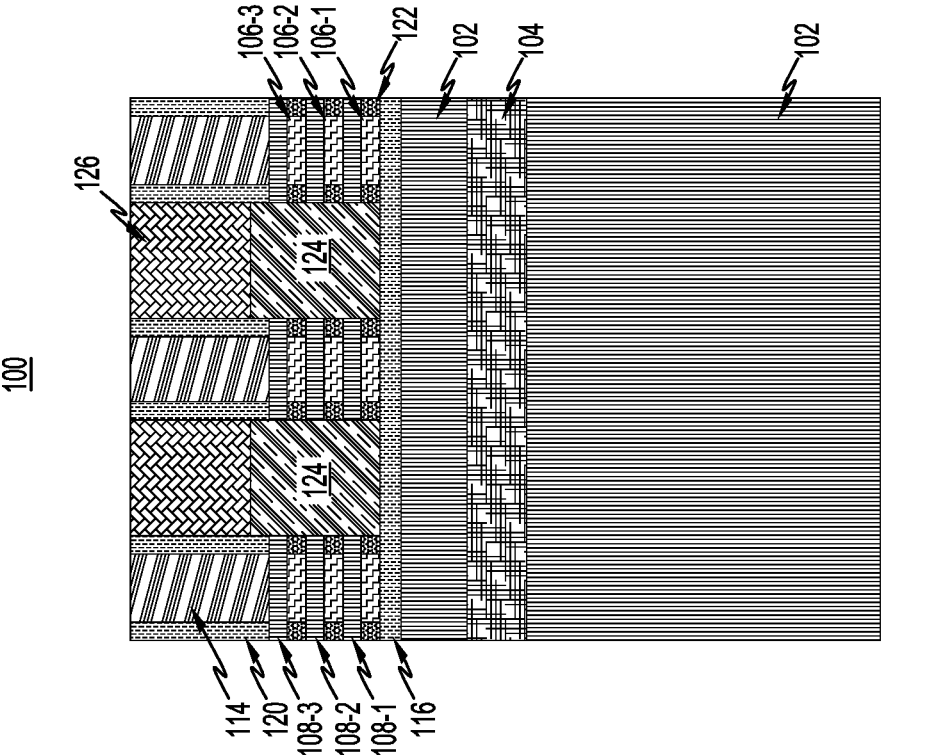
FIG. 5A is a cross-sectional view illustrating the semiconductor structure taken along the X1-X1 axis of FIG. 1A at a fifth-intermediate fabrication stage, according to an illustrative embodiment.
Figure 5C:
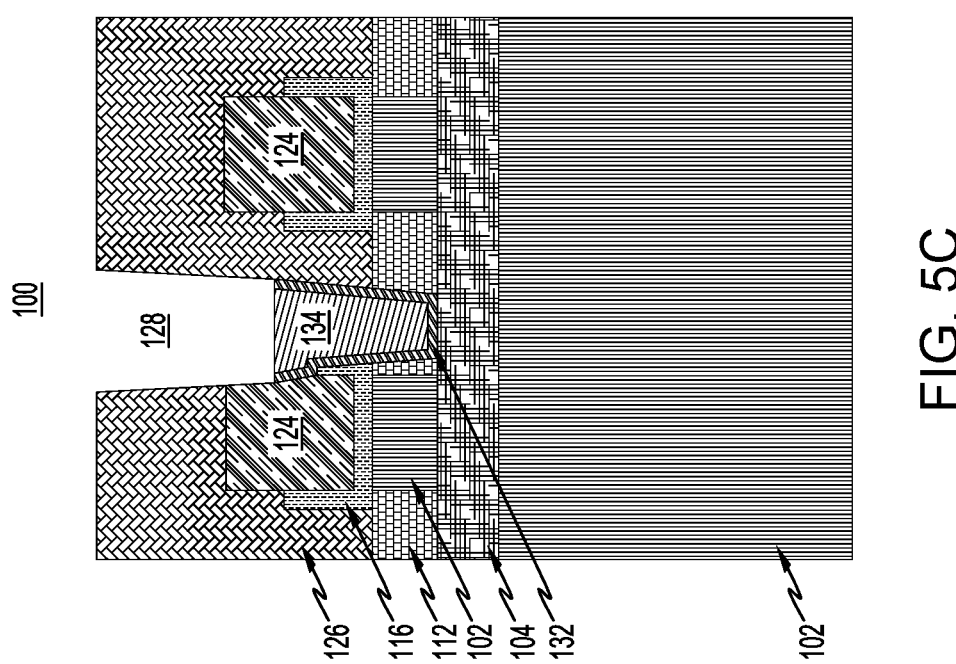
FIG. 5C is a cross-sectional view illustrating the semiconductor structure taken along the Y-Y axis of FIG. 1A at the fifth-intermediate fabrication stage, according to an illustrative embodiment.

FIGS. 5A-5C illustrate semiconductor structure 100 at a fifth-intermediate fabrication stage. During this stage, adhesion layer 132 is first formed on the exterior surface of the bottom portion of VBPR trench 128 including a portion of sidewall spacer 120 using any conventional deposition process such as ALD. Suitable material for adhesion layer 132 includes TiN. Next, a conductive metal is deposited on adhesion layer 132 and fills the bottom portion of VBPR trench 128 to form a lower portion VBPR 134. Suitable conductive metals include any conductive material such as, for example, tungsten (W), aluminum (Al), copper (Cu), cobalt (Co), nickel (Ni), titanium (Ti), ruthenium (Ru), molybdenum (Mo), or any other suitable conductive material. In various embodiments, the conductive metal can be deposited using any conventional deposition process such as ALD, CVD, PVD, and/or plating.

Figure 6A:
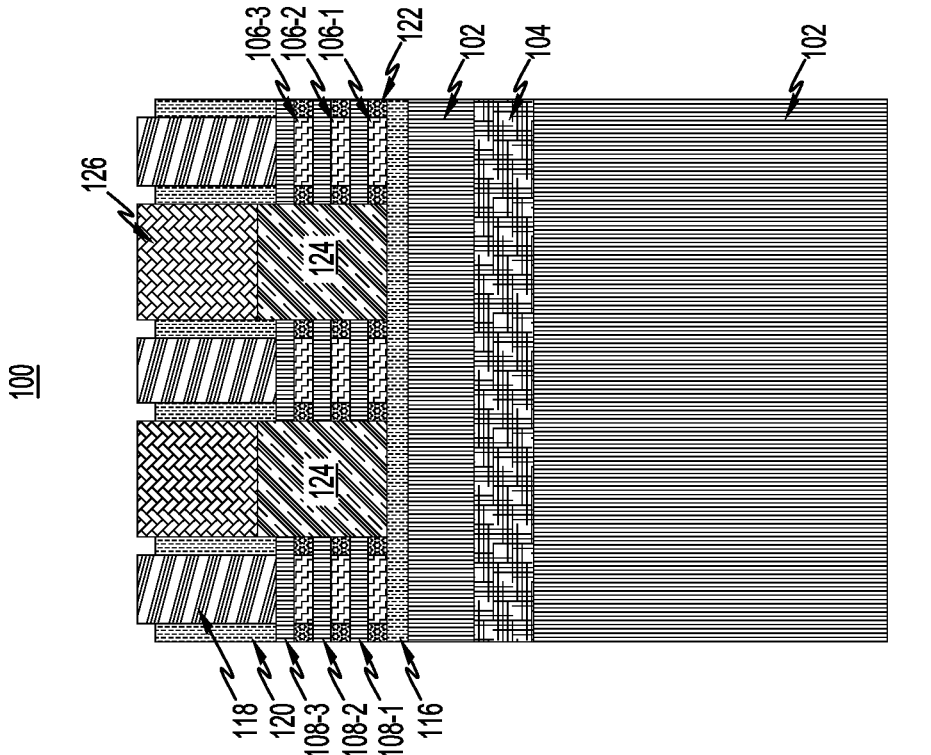
FIG. 6A is a cross-sectional view illustrating the semiconductor structure taken along the X1-X1 axis of FIG. 1A at a sixth-intermediate fabrication stage, according to an illustrative embodiment.
Figure 6C:
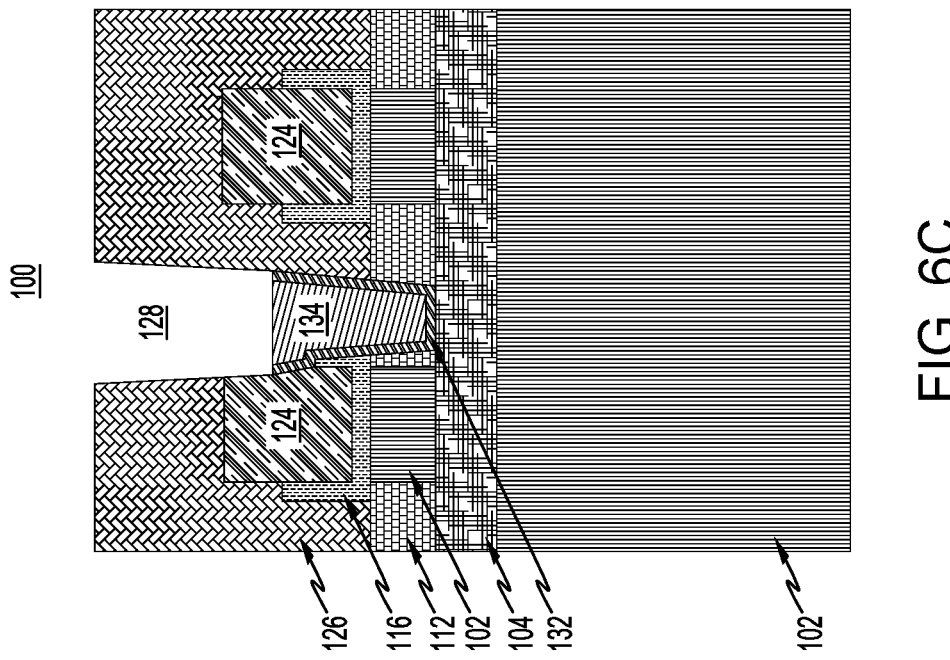
FIG. 6C is a cross-sectional view illustrating the semiconductor structure taken along the Y-Y axis of FIG. 1A at the sixth-intermediate fabrication stage, according to an illustrative embodiment.
Figure 6B:
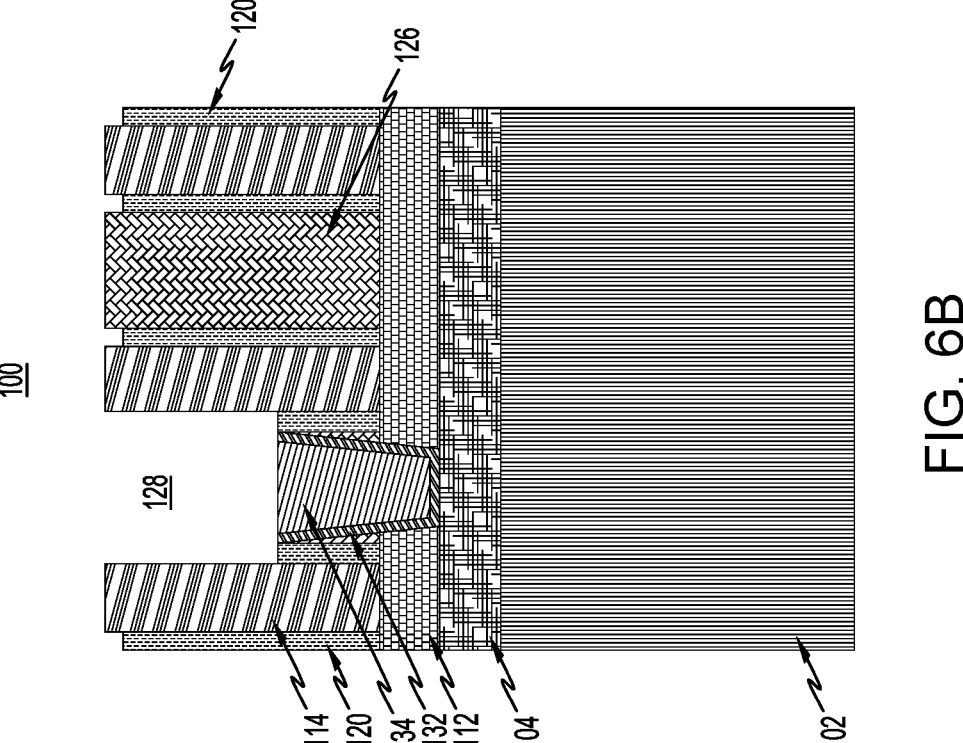
FIG. 6B is a cross-sectional view of the semiconductor structure taken along the X2-X2 axis of FIG. 1A at the sixth-intermediate fabrication stage, according to an illustrative embodiment.

FIGS. 6A-6C illustrate semiconductor structure 100 at a sixth-intermediate fabrication stage. During this stage, the exposed portion of sidewall spacer 120 in VBPR trench 128 is removed using a selective etch process such as a wet or dry etch. In illustrative embodiments, some portions of sidewall spacer 120 not in VBPR trench 128 are removed.

Figure 7B:
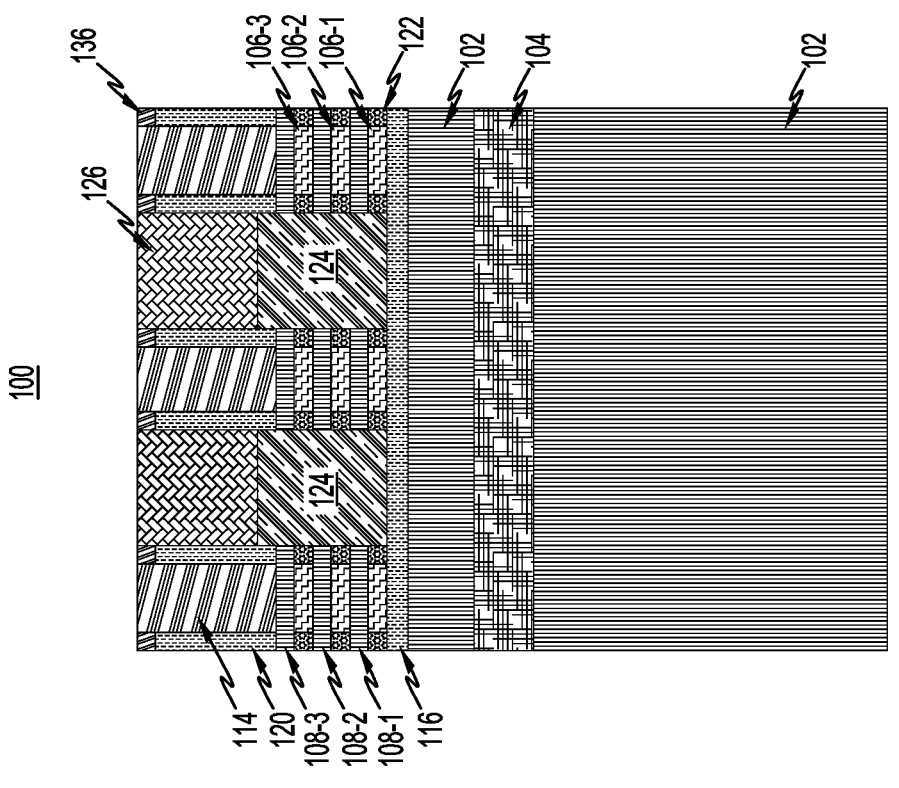
FIG. 7B is a cross-sectional view illustrating the semiconductor structure taken along the X1-X1 axis of FIG. 7A at the seventh-intermediate fabrication stage, according to an illustrative embodiment.
Figure 7A:
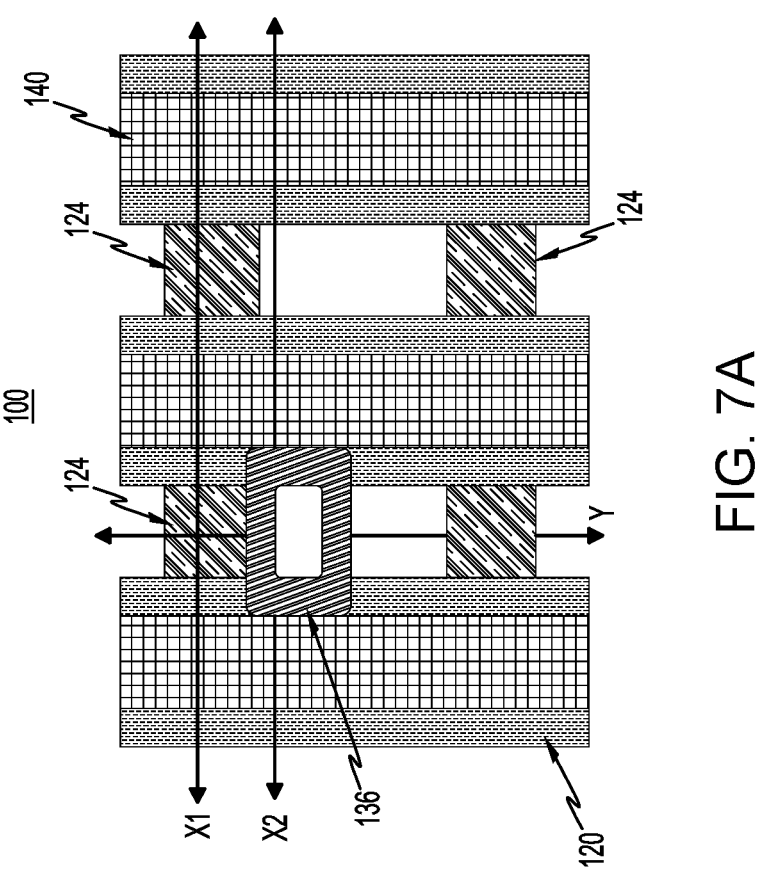
FIG. 7A is a top view illustrating the semiconductor structure at a seventh-intermediate fabrication stage, according to an illustrative embodiment.
Figure 7D:
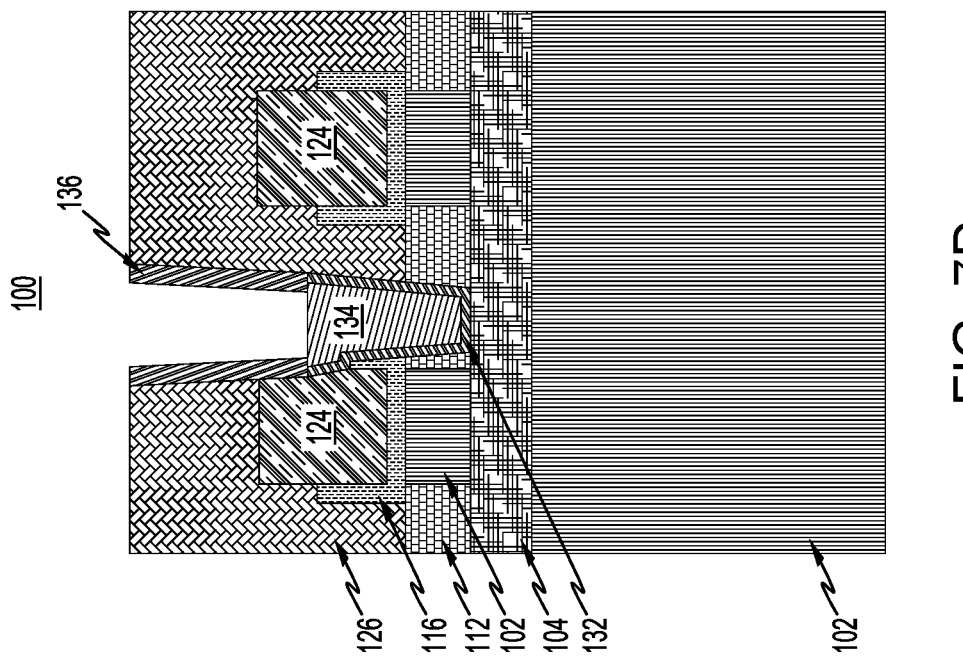
FIG. 7D is a cross-sectional view illustrating the semiconductor structure taken along the Y-Y axis of FIG. 7A at the seventh-intermediate fabrication stage, according to an illustrative embodiment.
Figure 7C:
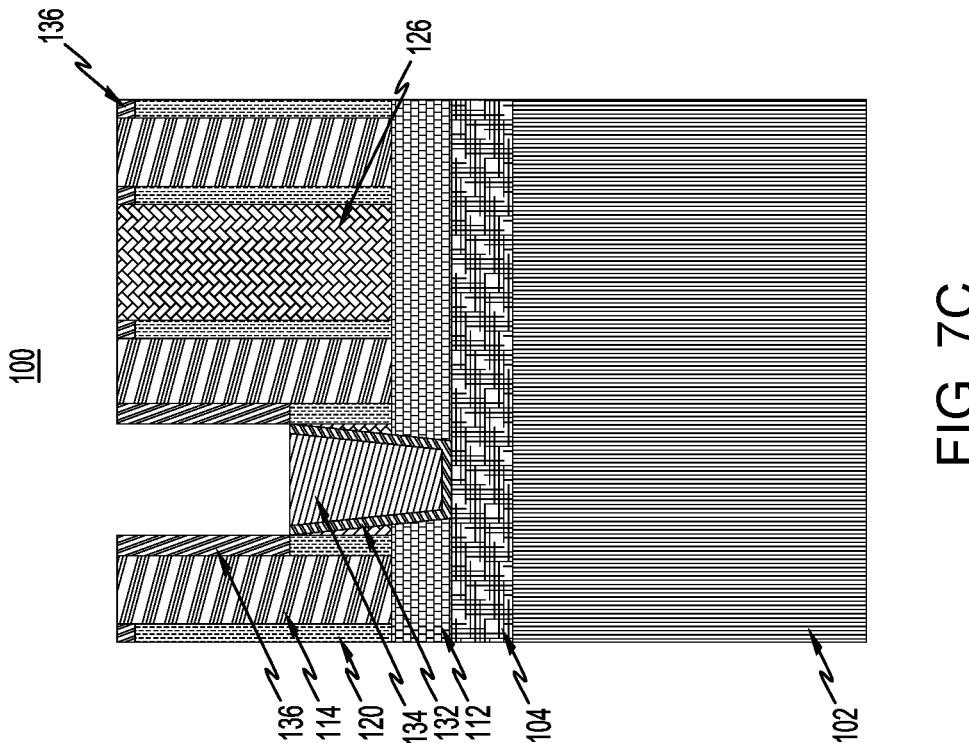
FIG. 7C is a cross-sectional view illustrating the semiconductor structure taken along the X2-X2 axis of FIG. 7A at the seventh-intermediate fabrication stage, according to an illustrative embodiment.
Figures 8A, 8B:
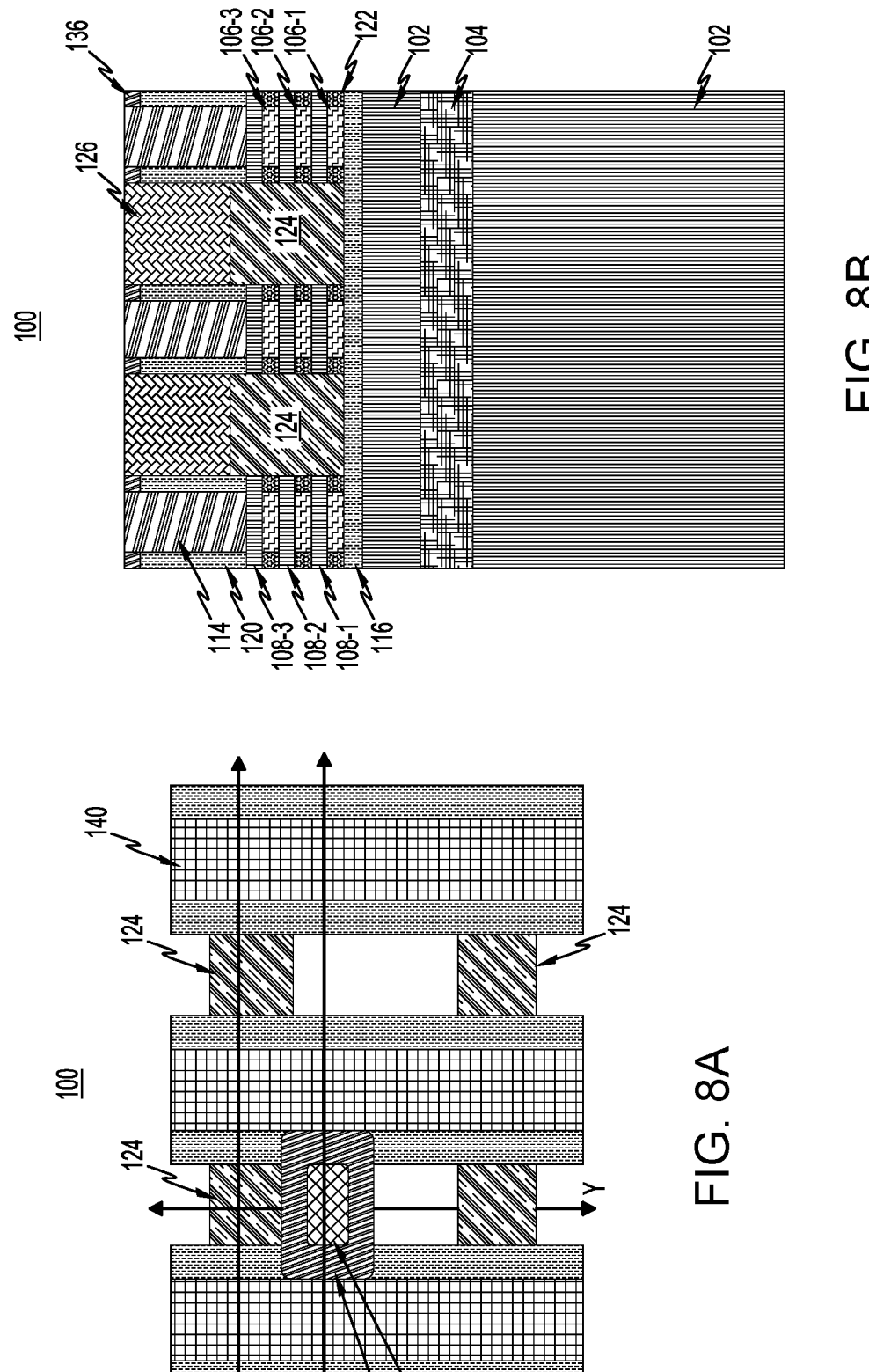
FIG. 8A is a top view illustrating the semiconductor structure at an eighth-intermediate fabrication stage, according to an illustrative embodiment.
FIG. 8B is a cross-sectional view illustrating the semiconductor structure taken along the X1-X1 axis of FIG. 8A at the eighth-intermediate fabrication stage, according to an illustrative embodiment.
Figure 8D:
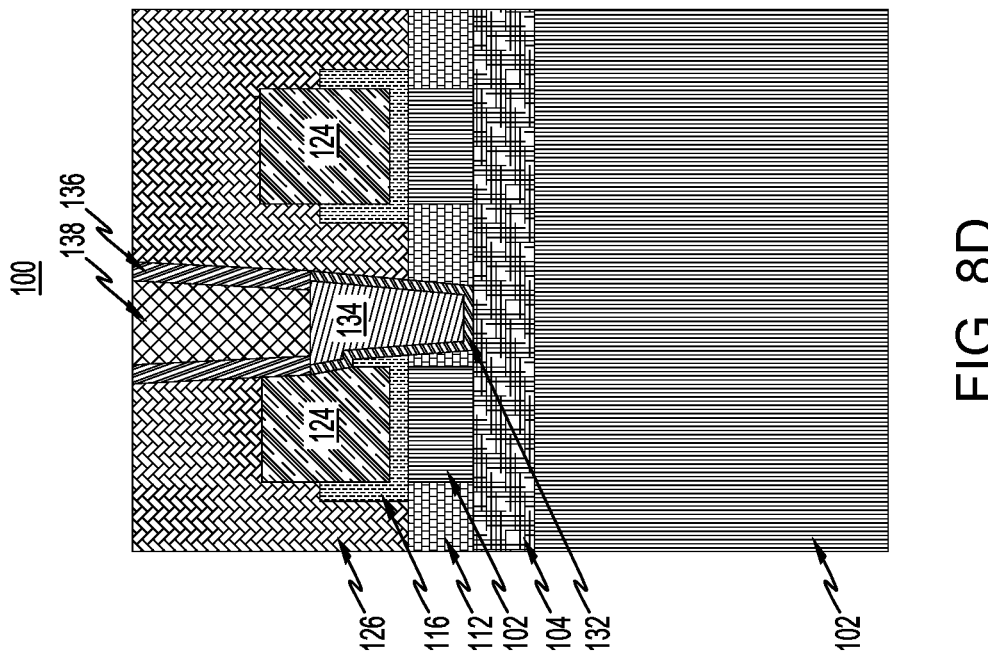
FIG. 8D is a cross-sectional view illustrating the semiconductor structure taken along the Y-Y axis of FIG. 8A at the eighth-intermediate fabrication stage, according to an illustrative embodiment.
Figure 8C:
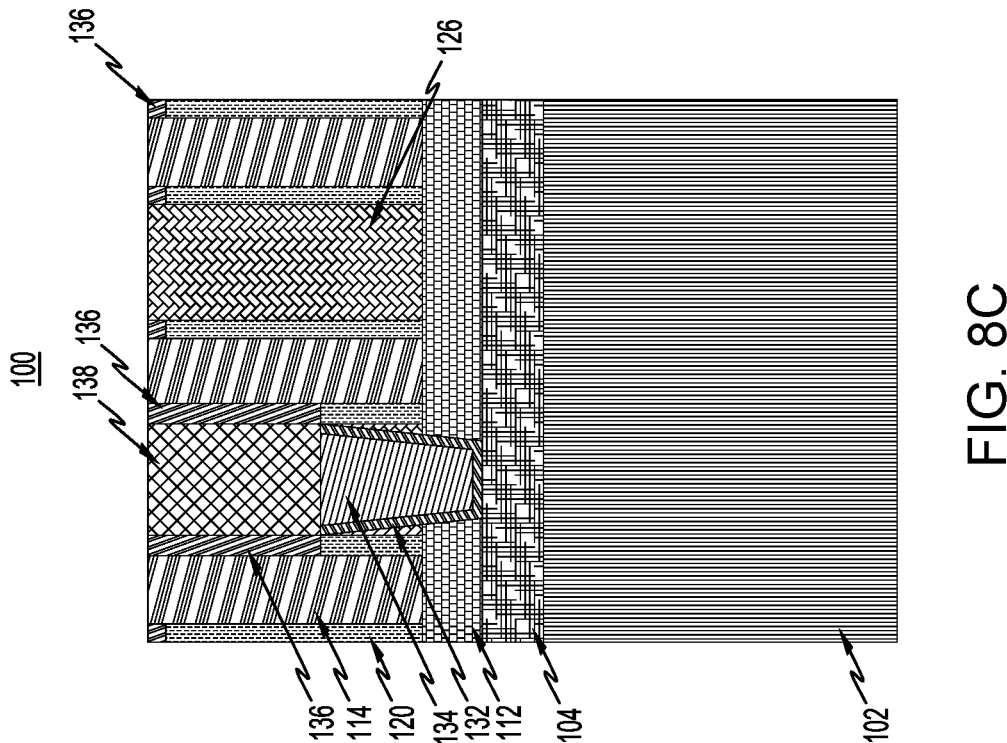
FIG. 8C is a cross-sectional view illustrating the semiconductor structure taken along the X2-X2 axis of FIG. 8A at the eighth-intermediate fabrication stage, according to an illustrative embodiment.

FIGS. 7A-7D illustrate semiconductor structure 100 at a seventh-intermediate fabrication stage. During this stage, a gate sidewall spacer 136 is deposited and anisotropically etched (e.g., dry etch) on sidewalls of dummy gate layer 114 and aligned with the remaining sidewall spacer 120 in VBPR trench 128 using any conventional deposition process such as ALD, CVD or PVD as depicted in FIG. 7C. Gate sidewall spacer 136 is further deposited on sidewalls of ILD layer 126 in VBPR trench 128 as depicted in FIG. 7D. In addition, gate sidewall spacer 136 is further deposited on semiconductor structure 100 so that it covers both flat and sidewall surfaces. In illustrative embodiments, gate sidewall spacer 136 comprises a dielectric material to form a dielectric spacer as gate sidewall spacer 136. Next, an anisotropic etch (e.g., dry etch) is carried out to etch only the flat surface (i.e., horizontal surfaces), thereby leaving gate sidewall spacer 136 only on sidewall surfaces and on the top surface of sidewall spacer 120.

FIGS. 8A-8D illustrate semiconductor structure 100 at an eighth-intermediate fabrication stage. During this stage, sacrificial layer 138 is deposited in and filling VBPR trench 128 using any conventional deposition process such as ALD, CVD or PVD followed by a planarization process such as CMP. The sacrificial layer 138 can comprise a material such as TiOx, AlOx, SiC, etc.

Figure 9B:
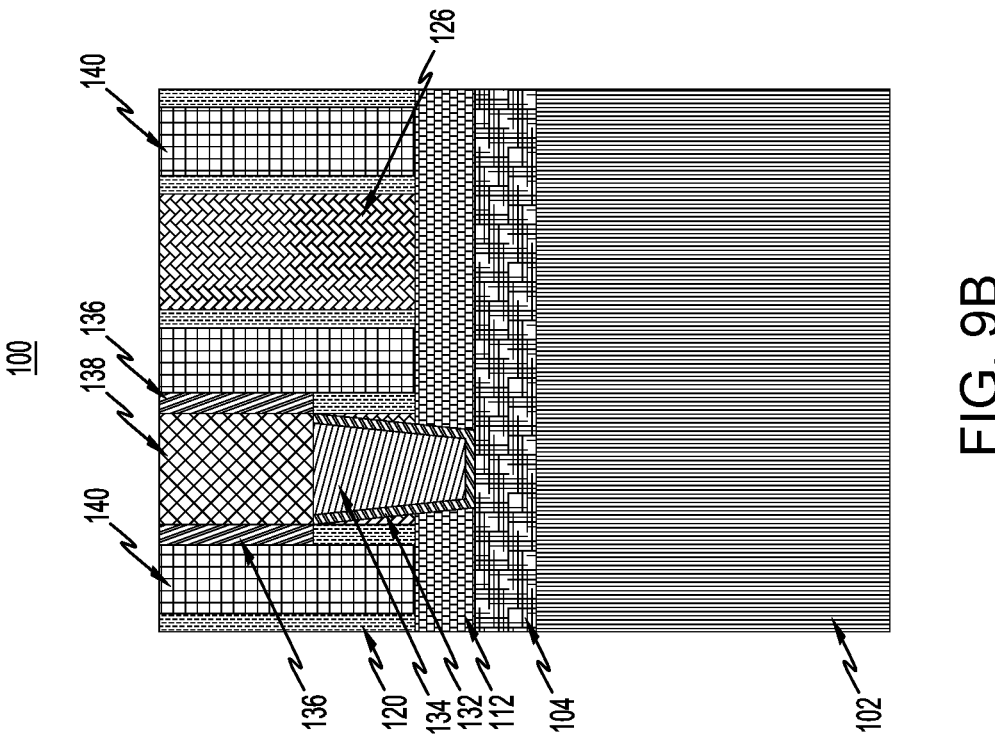
FIG. 9B is a cross-sectional view illustrating the semiconductor structure taken along the X2-X2 axis of FIG. 8A at the ninth-intermediate fabrication stage, according to an illustrative embodiment.
Figure 9A:
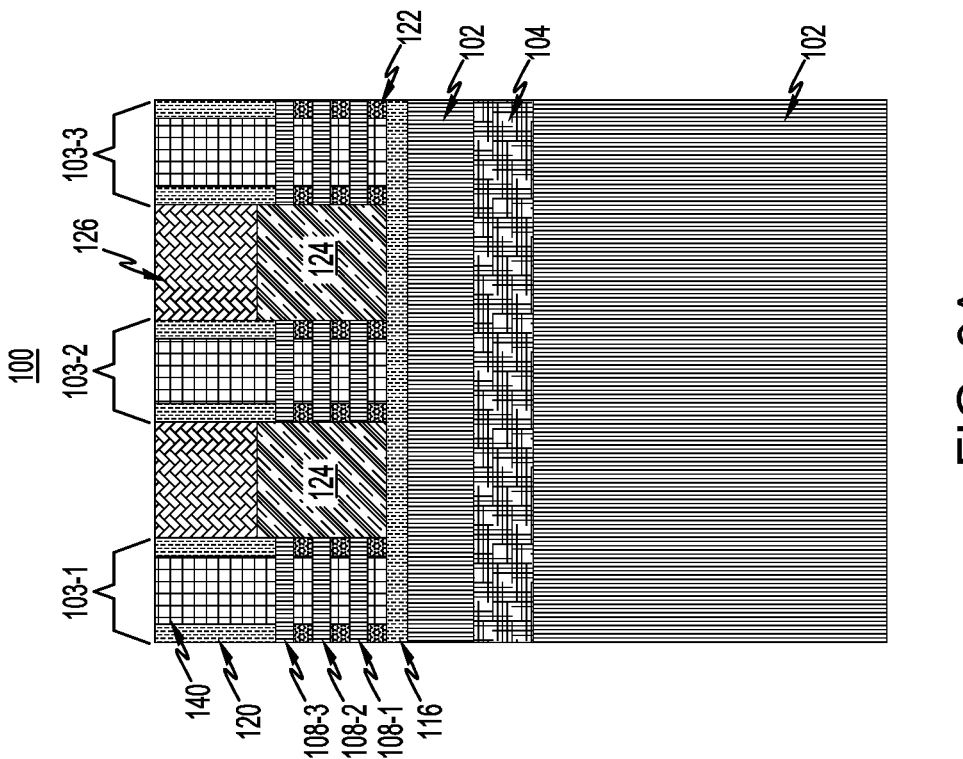
FIG. 9A is a cross-sectional view illustrating the semiconductor structure taken along the X1-X1 axis of FIG. 8A at a ninth-intermediate fabrication stage, according to an illustrative embodiment.
Figure 9C:
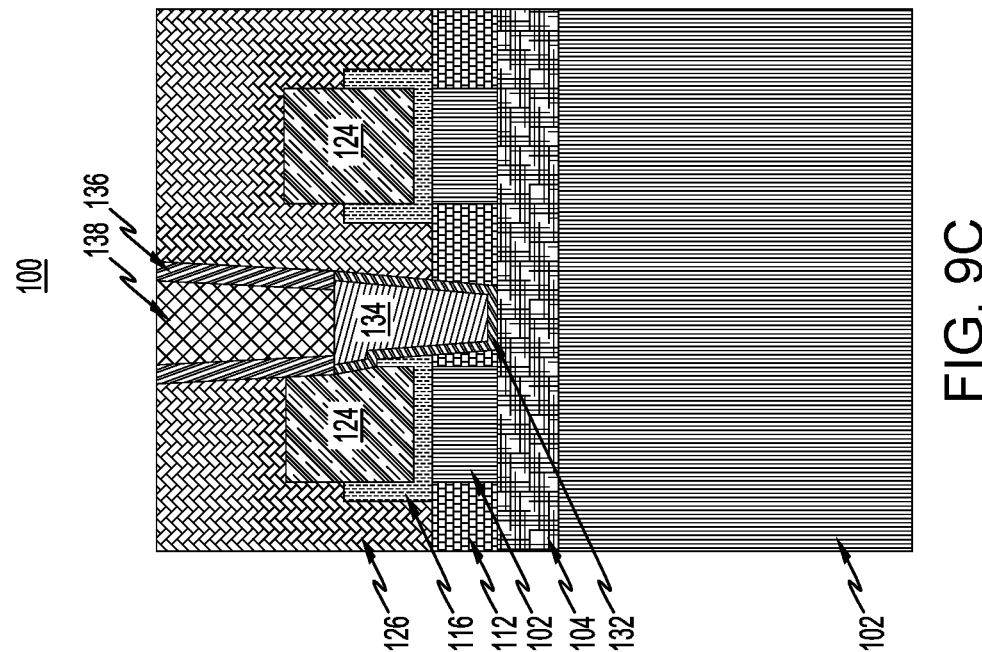
FIG. 9C is a cross-sectional view illustrating the semiconductor structure taken along the Y-Y axis of FIG. 8A at the ninth-intermediate fabrication stage, according to an illustrative embodiment.

FIGS. 9A-9C illustrate semiconductor structure 100 at a ninth-intermediate fabrication stage. During this stage, dummy gate layer 114 and sacrificial layers 106-1, 106-2 and 106-3 are removed, followed by formation of the gate stack layer 140 (e.g., using replacement HKMG processing) to form gate structures 103-1, 103-2 and 103-3.

The gate stack layer 140 may comprise a gate dielectric layer and a gate conductor layer. The gate dielectric layer may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg).

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

Figure 10B:
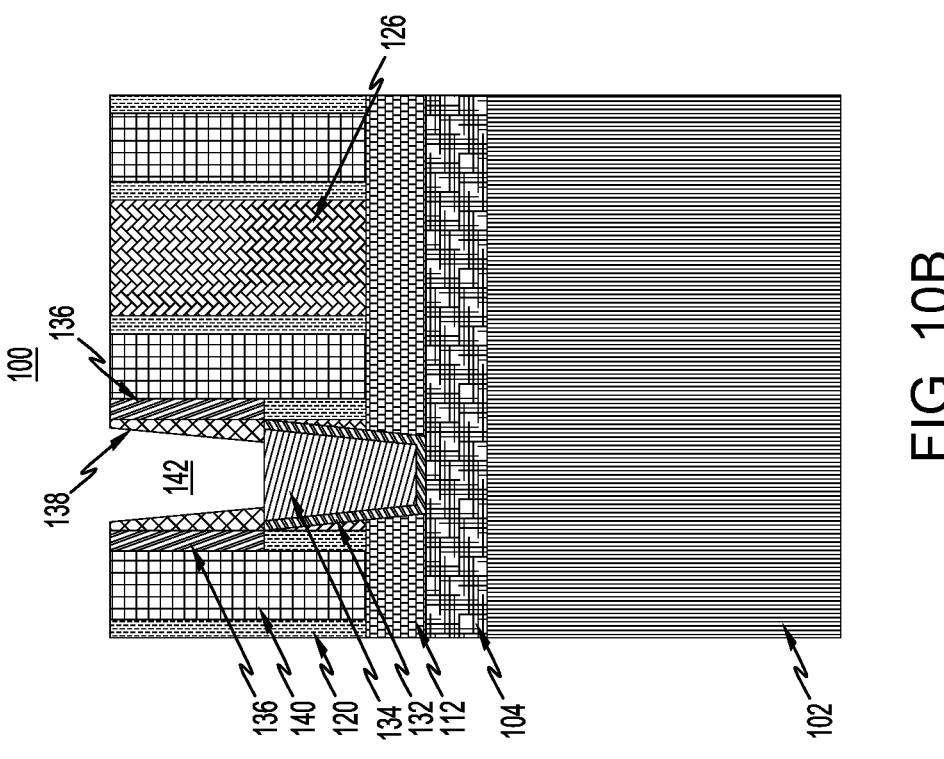
FIG. 10B is a cross-sectional view illustrating the semiconductor structure taken along the X2-X2 axis of FIG. 8A at the tenth-intermediate fabrication stage, according to an illustrative embodiment.
Figure 10A:
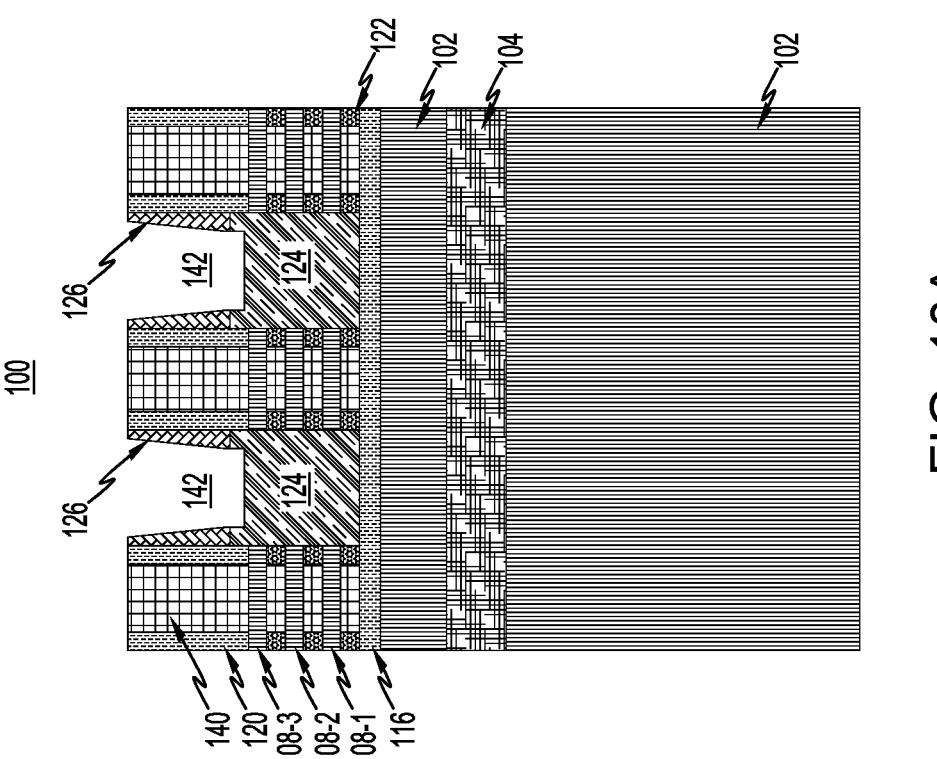
FIG. 10A is a cross-sectional view illustrating the semiconductor structure taken along the X1-X1 axis of FIG. 8A at a tenth-intermediate fabrication stage, according to an illustrative embodiment.
Figure 10C:
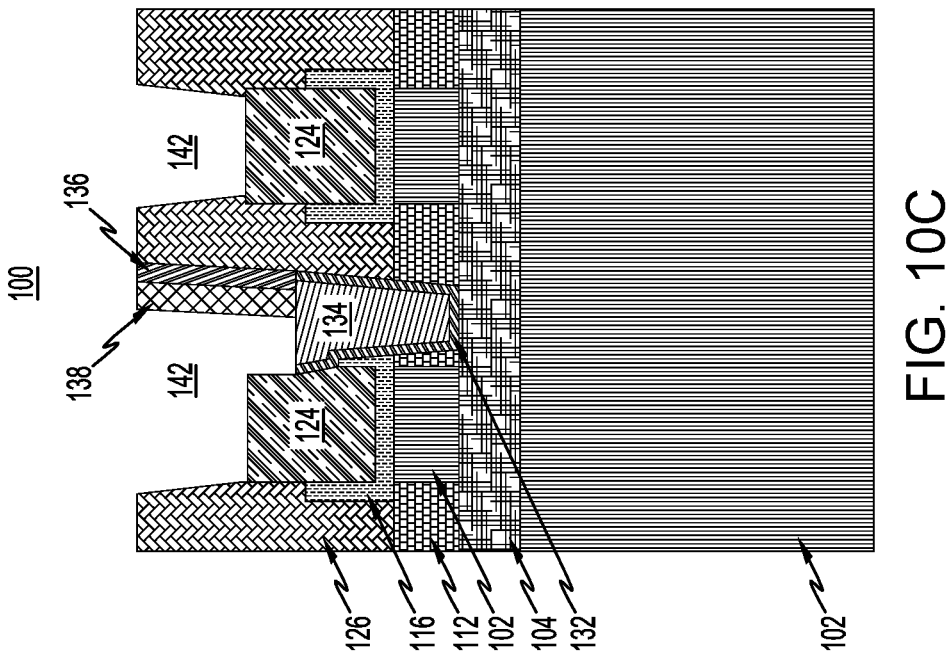
FIG. 10C is a cross-sectional view illustrating the semiconductor structure taken along the Y-Y axis of FIG. 8A at the tenth-intermediate fabrication stage, according to an illustrative embodiment.

FIGS. 10A-10C illustrate semiconductor structure 100 at a tenth-intermediate fabrication stage. During this stage, middle-of-the-line contact openings 142 are formed in ILD layer 126 as well as sacrificial layer 138 using a selective etch process such as a wet or dry etch.

Figure 11B:
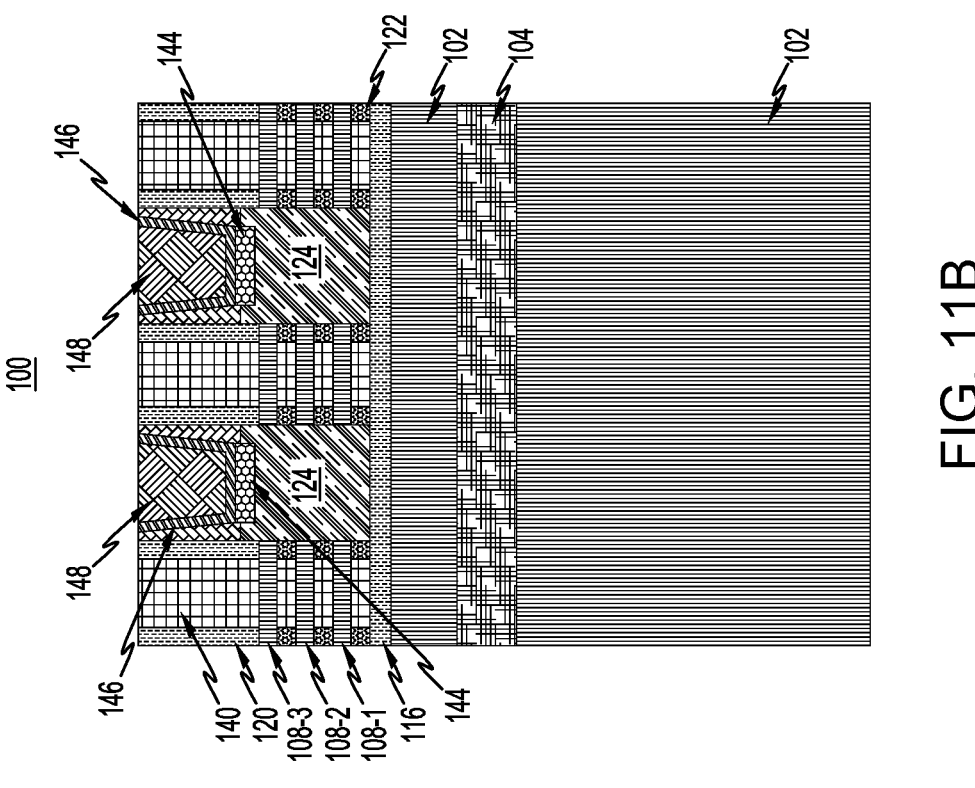
FIG. 11B is a cross-sectional view illustrating the semiconductor structure taken along the X1-X1 axis of FIG. 11A at the eleventh-intermediate fabrication stage, according to an illustrative embodiment.
Figure 11A:
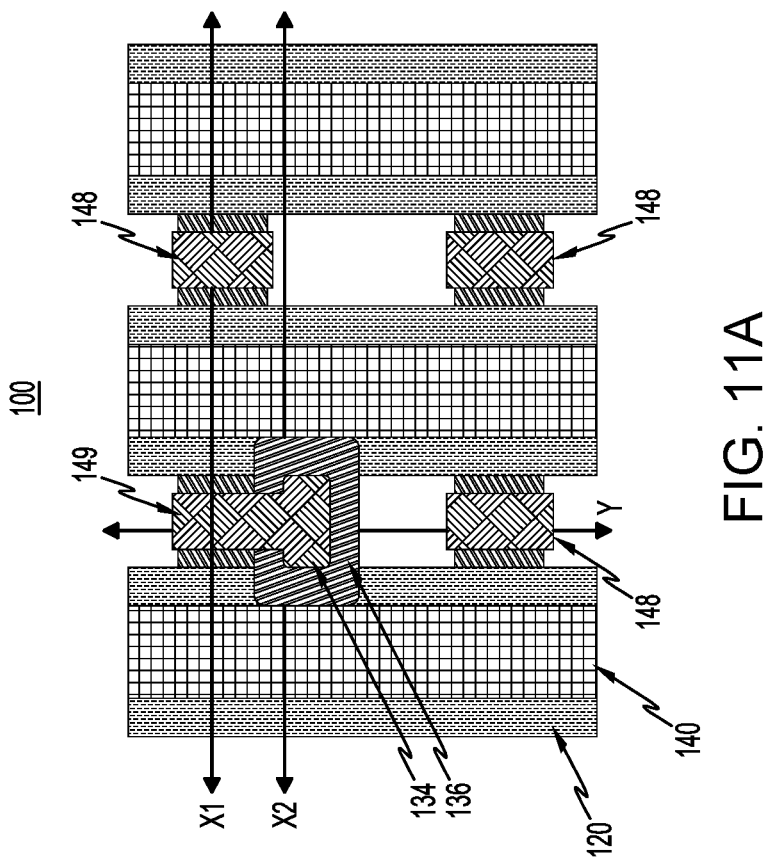
FIG. 11A is a top view illustrating the semiconductor structure at an eleventh-intermediate fabrication stage, according to an illustrative embodiment.
Figure 11D:
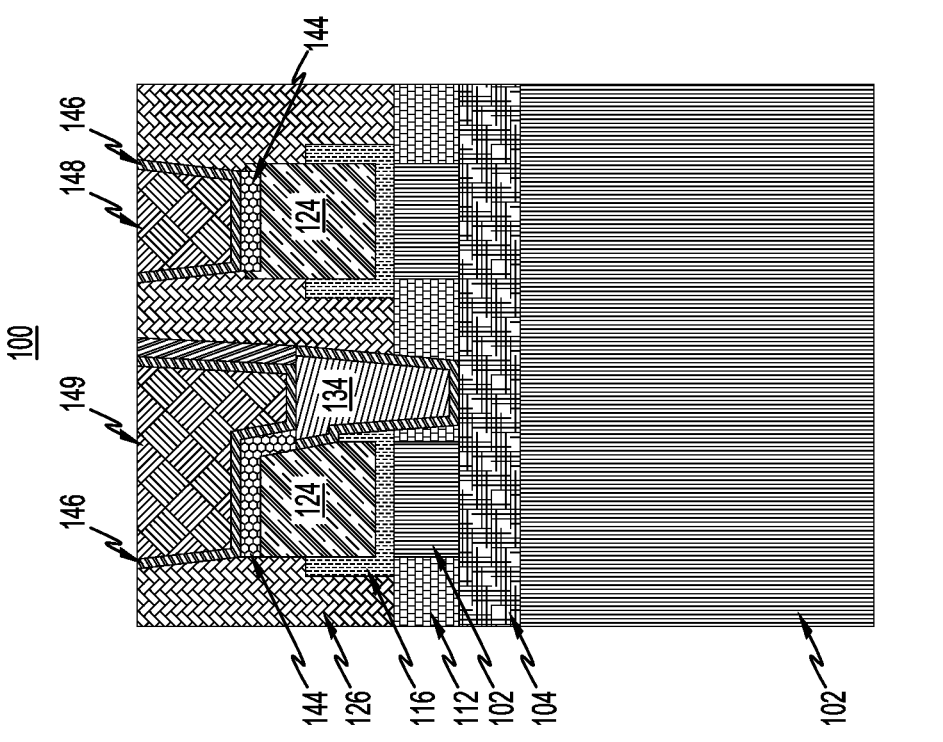
FIG. 11D is a cross-sectional view illustrating the semiconductor structure taken along the Y-Y axis of FIG. 11A at the eleventh-intermediate fabrication stage, according to an illustrative embodiment.

FIGS. 11A-11D illustrate semiconductor structure 100 at an eleventh-intermediate fabrication stage. During this stage, the remaining portion of sacrificial layer 138 is removed by a selective etch such as RIE, followed by depositing a contact liner, adhesion layer and a conductive metal using any conventional deposition process such as ALD, in accordance with illustrative embodiments. As depicted in FIGS. 11B and 11D, contact liner 144 is deposited in the middle-of-the-line contact openings 142 left by the removal of sacrificial layer 138 in the previous step. Contact liner 144 can be composed of a metal, such as, Ti, Ni, NiPt, or other similar metal and can form a silicide with bottom source/drain regions 124. Adhesion layer 146 can be composed of TiN. Next, a conductive metal is deposited on adhesion layer 146 and fills the middle-of-the-line contact openings 142 to form middle-of-the-line contacts 148. Suitable conductive metals can be any of those discussed above.

Figure 11C:
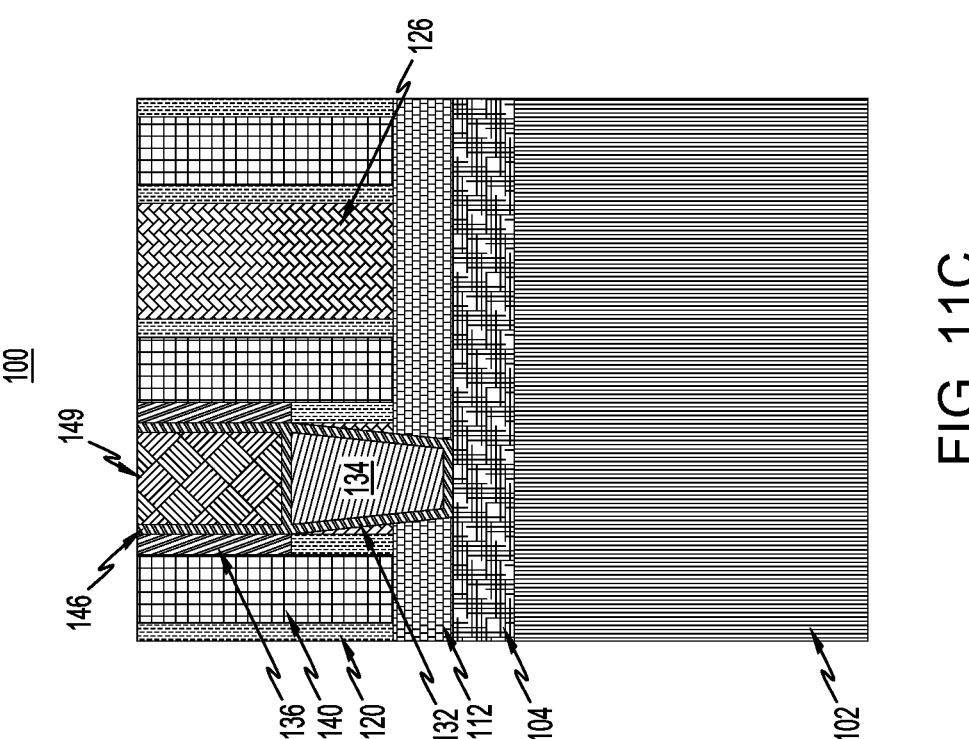
FIG. 11C is a cross-sectional view illustrating the semiconductor structure taken along the X2-X2 axis of FIG. 11A at the eleventh-intermediate fabrication stage, according to an illustrative embodiment.

In illustrative embodiments, FIG. 11C and FIG. 11D show adhesion layer 146 formed on the exterior of middle-of-the-line contact openings 142 and on the top surface of lower portion VBPR 134 followed by a conductive metal deposited in middle-of-the-line contact openings 142 to form an upper portion VBPR 149 over lower portion VBPR 134. The upper portion VBPR 149 further includes a middle-of-the-line contact over bottom source/drain regions 124 as depicted in FIG. 11D.

Figure 12B:
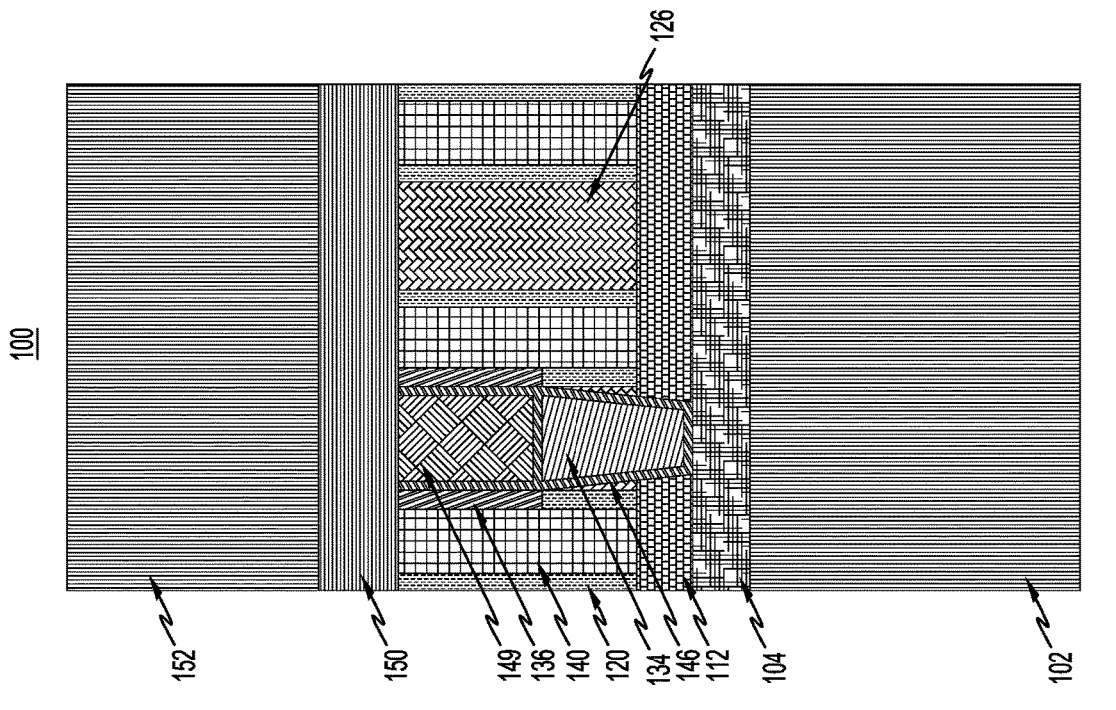
FIG. 12B is a cross-sectional view illustrating the semiconductor structure taken along the X2-X2 axis of FIG. 11A at a twelfth-intermediate fabrication stage, according to an illustrative embodiment.
Figure 12A:
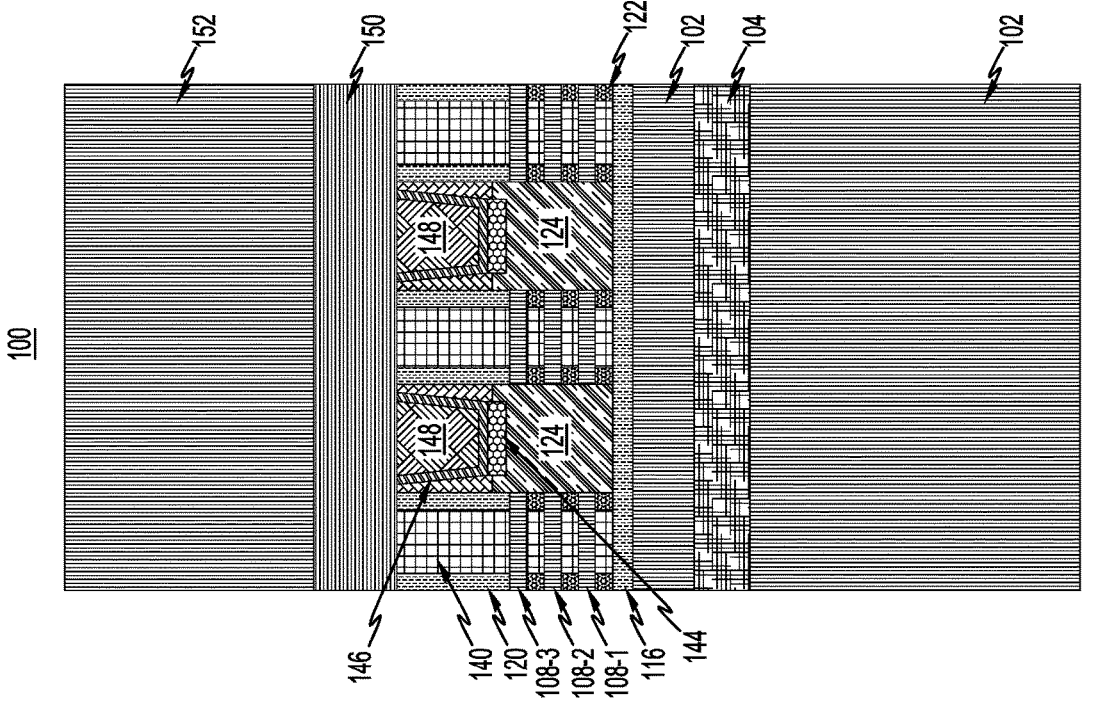
FIG. 12A is a cross-sectional view illustrating the semiconductor structure taken along the X1-X1 axis of FIG. 11A at a twelfth-intermediate fabrication stage, according to an illustrative embodiment.
Figure 12C:
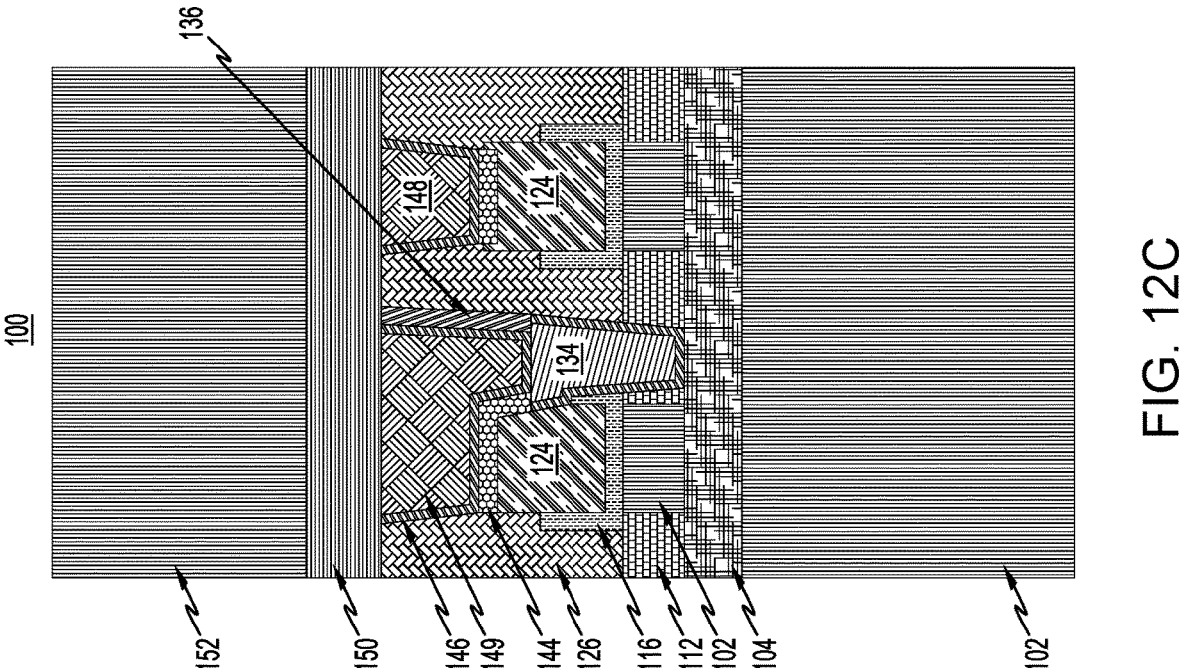
FIG. 12C is a cross-sectional view illustrating the semiconductor structure taken along the Y-Y axis of FIG. 11A at a twelfth-intermediate fabrication stage, according to an illustrative embodiment.

FIGS. 12A-12C illustrate semiconductor structure 100 at a twelfth-intermediate fabrication stage. During this stage, frontside back-end-of-line (BEOL) interconnect 150 is formed followed by bonding of the structure (e.g., the frontside BEOL interconnect 150) to a carrier wafer 152. The frontside BEOL interconnect 150 includes various BEOL interconnect structures. For example, frontside BEOL interconnect 150 is a metallization structure that includes one or more metal layers disposed on a side of semiconductor structure 100 opposite of the side on which the backside BEOL metallization structure is disposed. The metal layers of the frontside BEOL interconnect 150 each have metal lines for making interconnections to the semiconductor device.

The carrier wafer 152 may be formed of materials similar to that of the substrate 102, and may be formed over the frontside BEOL interconnect 150 using a wafer bonding process, such as dielectric-to-dielectric bonding.

Figure 13A:
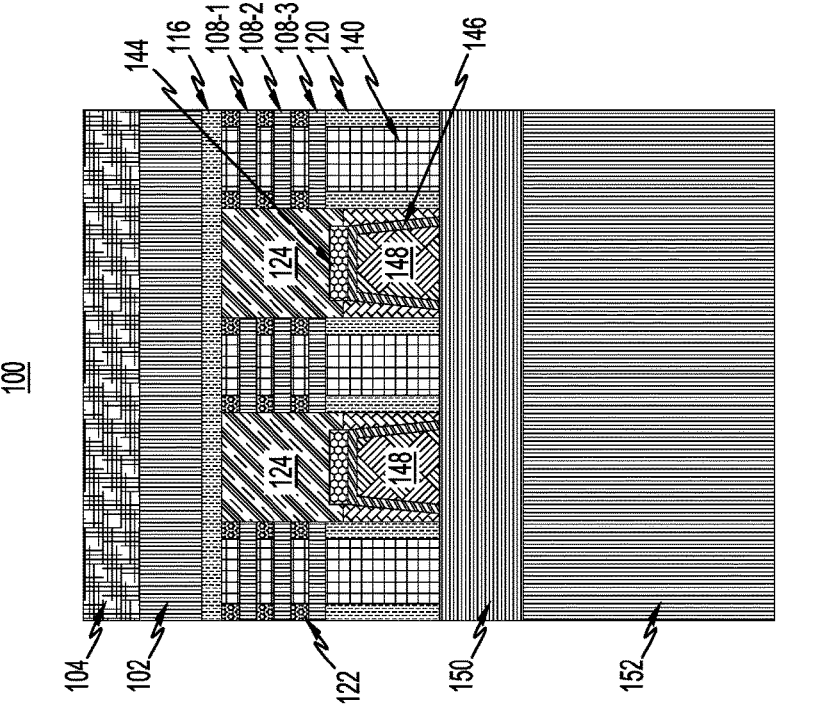
FIG. 13A is a cross-sectional view illustrating the semiconductor structure taken along the X1-X1 axis of FIG. 11A at a thirteenth-intermediate fabrication stage, according to an illustrative embodiment.
Figure 13C:
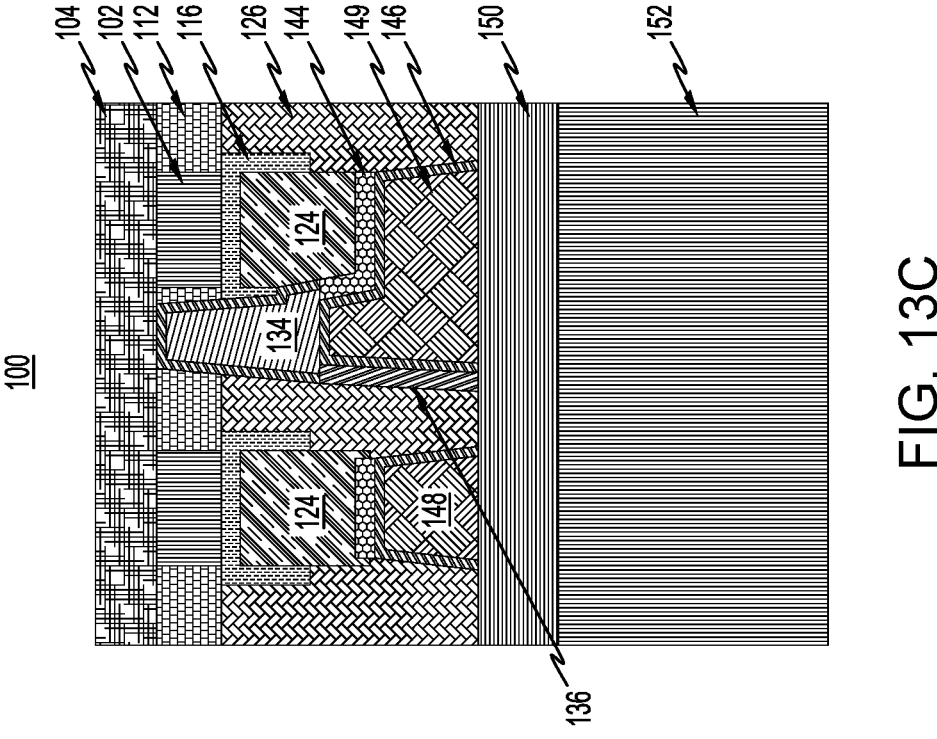
FIG. 13C is a cross-sectional view illustrating the semiconductor structure taken along the Y-Y axis of FIG. 11A at the thirteenth-intermediate fabrication stage, according to an illustrative embodiment.
Figure 13B:
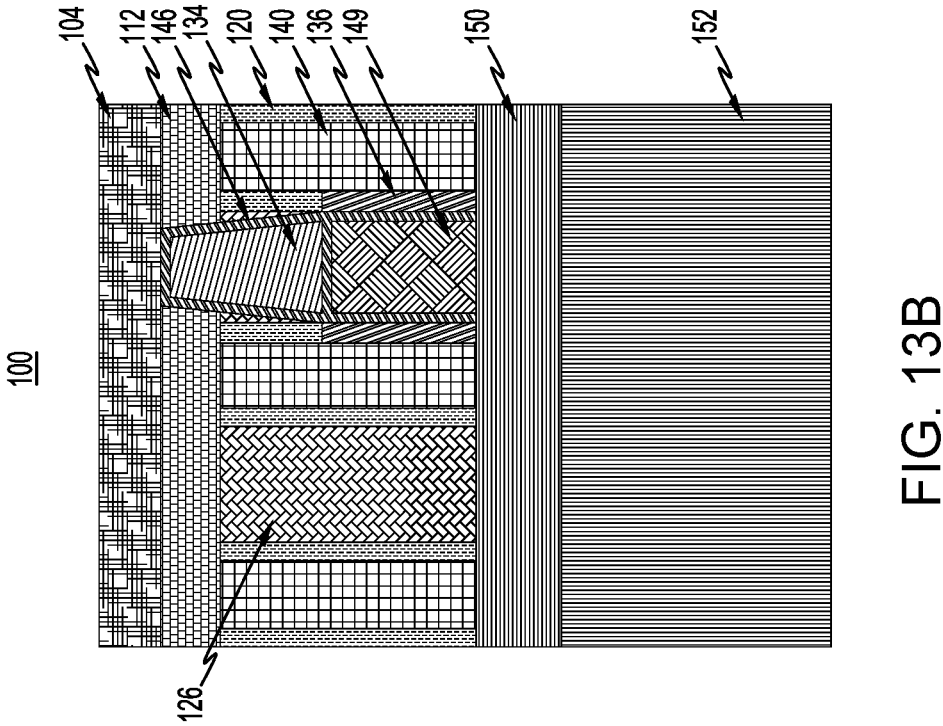
FIG. 13B is a cross-sectional view illustrating the semiconductor structure taken along the X2-X2 axis of FIG. 11A at the thirteenth-intermediate fabrication stage, according to an illustrative embodiment.

FIGS. 13A-13C illustrate semiconductor structure 100 at a thirteenth-intermediate fabrication stage. During this stage, using the carrier wafer 152, the structure is "flipped" over so that the backside of the substrate 102 (i.e., the back surface) is facing up for backside processing as shown. Next, portions of the substrate 102 may be removed from the backside using, for example, a wet etch to selectively remove substrate 102 until the etch stop layer 104 is reached.

Figure 14B:
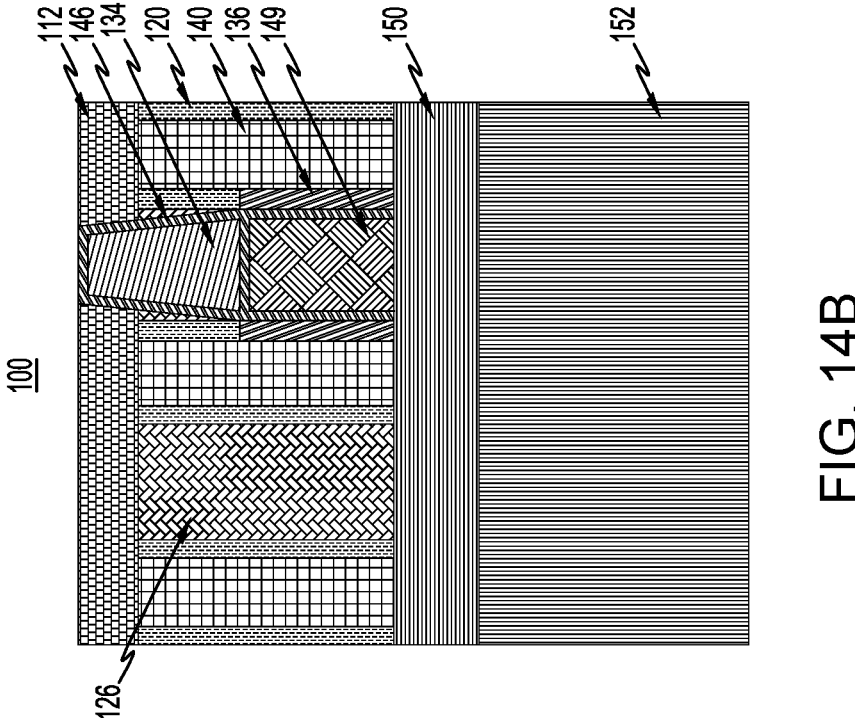
FIG. 14B is a cross-sectional view illustrating the semiconductor structure taken along the X2-X2 axis of FIG. 11A at the fourteenth-intermediate fabrication stage, according to an illustrative embodiment.
Figure 14A:
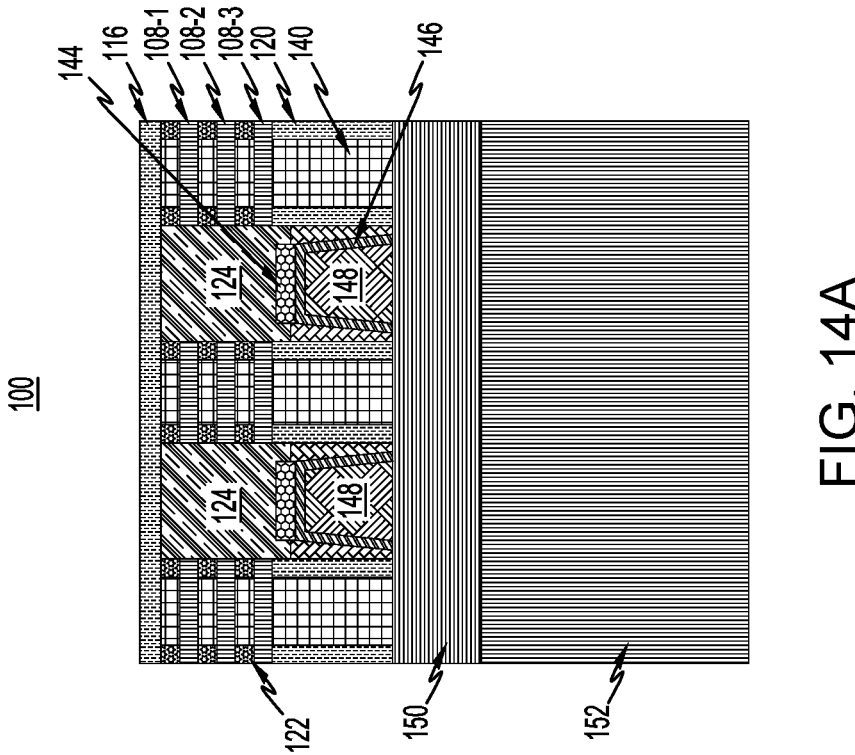
FIG. 14A is a cross-sectional view illustrating the semiconductor structure taken along the X1-X1 axis of FIG. 11A at a fourteenth-intermediate fabrication stage, according to an illustrative embodiment.
Figure 14C:
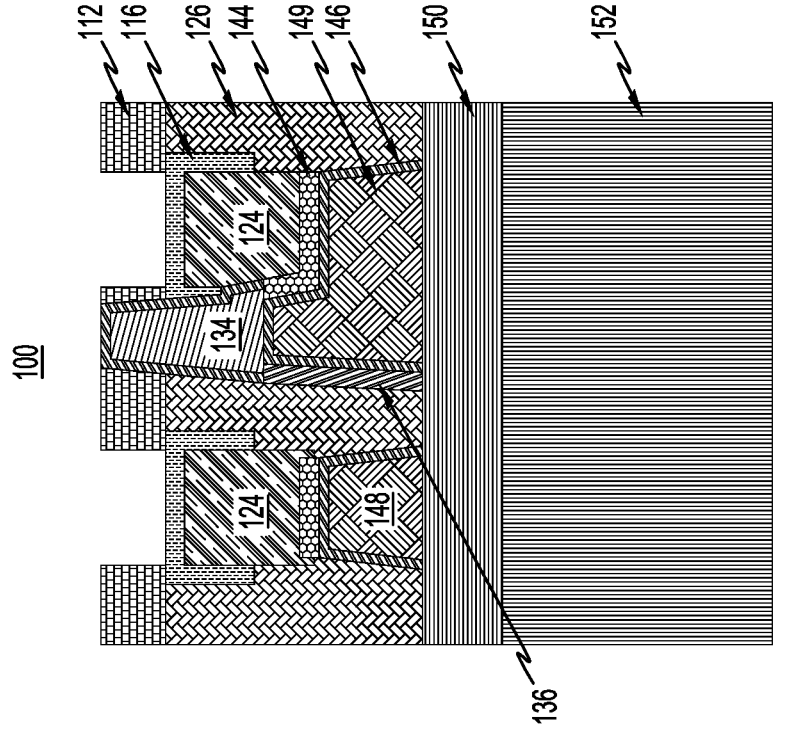
FIG. 14C is a cross-sectional view illustrating the semiconductor structure taken along the Y-Y axis of FIG. 11A at the fourteenth-intermediate fabrication stage, according to an illustrative embodiment.

FIGS. 14A-14C illustrate semiconductor structure 100 at a fourteenth-intermediate fabrication stage. During this stage, the etch stop layer 104 is selectively removed using, for example, a wet etch to selectively remove etch stop layer 104 until substrate 102 is reached. The remaining portions of the substrate 102 are removed to expose the BDI layer 116, STI region 112 and adhesion layer 146. The remaining portions of the substrate 102 can be removed utilizing a selective etch process such as a wet etch.

Figure 15A:
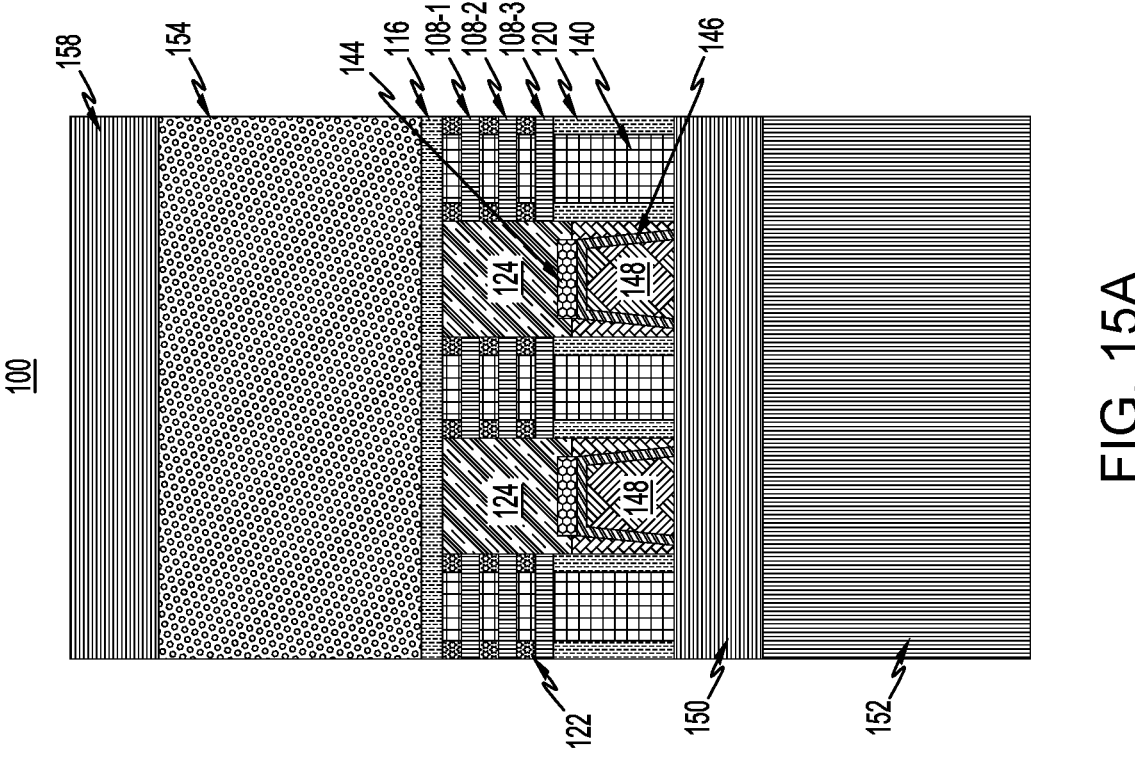
FIG. 15A is a cross-sectional view illustrating the semiconductor structure taken along the X1-X1 axis of FIG. 11A at a fifteenth-intermediate fabrication stage, according to an illustrative embodiment.
Figure 15C:
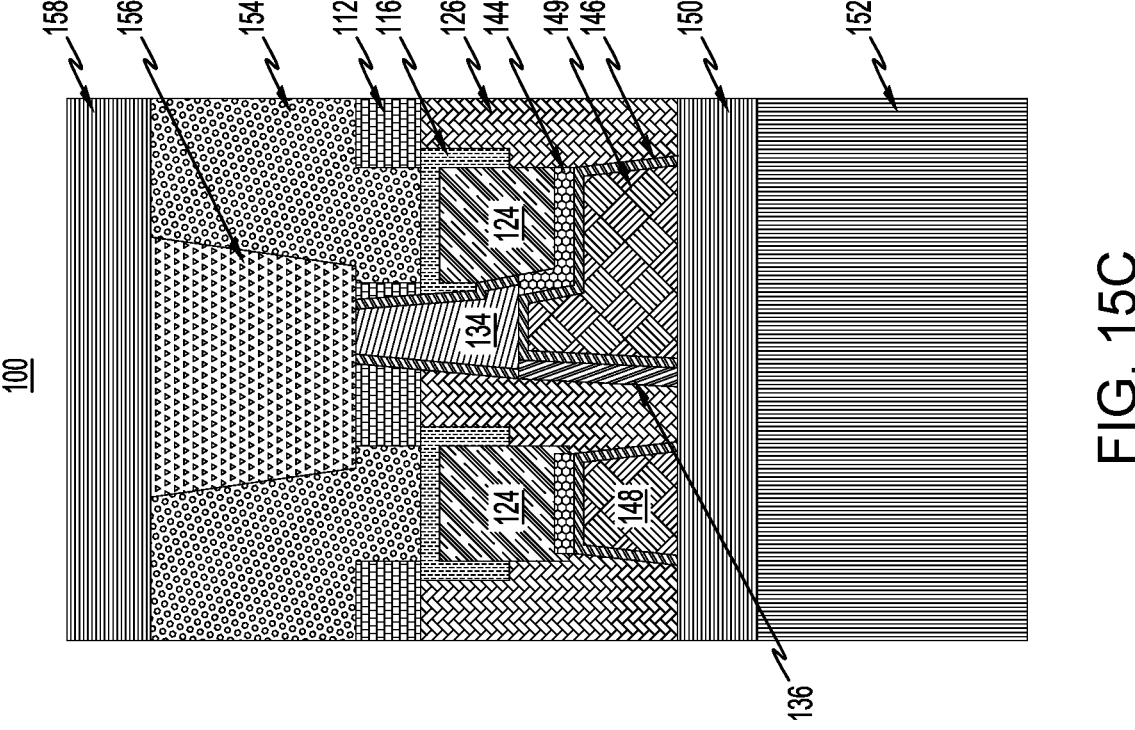
FIG. 15C is a cross-sectional view illustrating the semiconductor structure taken along the Y-Y axis of FIG. 11A at the fifteenth-intermediate fabrication stage, according to an illustrative embodiment.
Figure 15B:
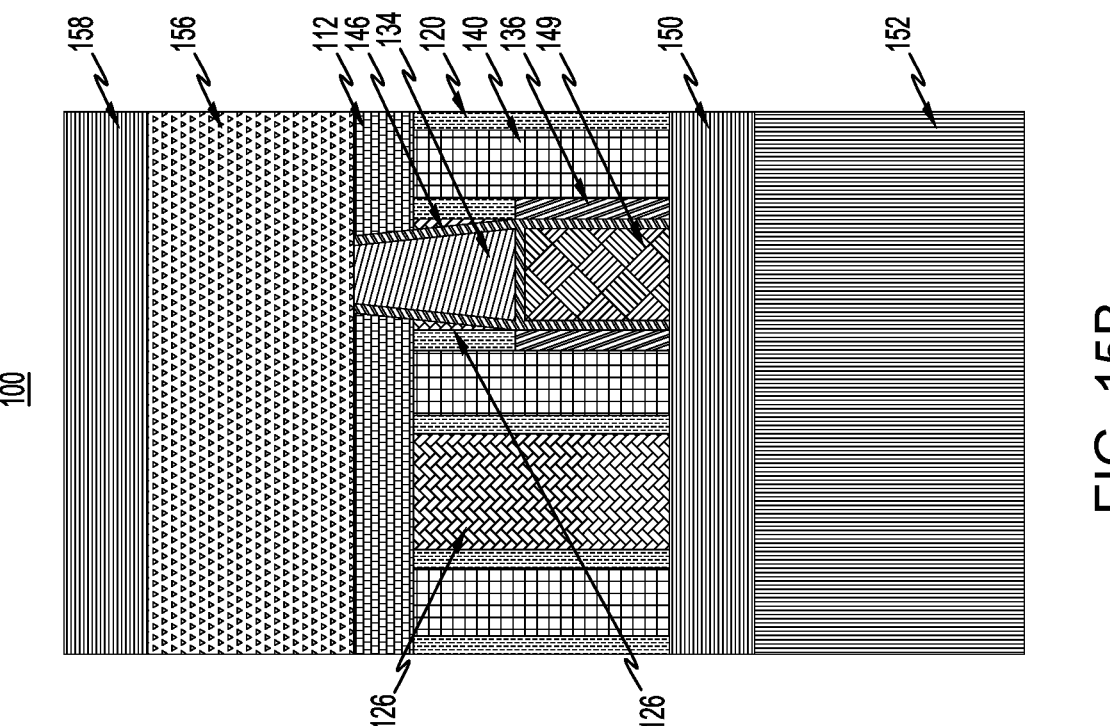
FIG. 15B is a cross-sectional view illustrating the semiconductor structure taken along the X2-X2 axis of FIG. 11A at the fifteenth-intermediate fabrication stage, according to an illustrative embodiment.

FIGS. 15A-15C illustrate semiconductor structure 100 at a fifteenth-intermediate fabrication stage. During this stage, backside ILD layer 154 may be formed of similar materials as the ILD layer 126. The material of the backside ILD layer 154 may initially be overfilled, followed by planarization (e.g., using CMP). Next, backside power rail 156 is formed in backside ILD layer 154 by first patterning and etching vias in the exposed backside ILD layer 154. A suitable conductive metal is then deposited in the vias and on top of backside ILD layer 154, followed by CMP to remove any metal on top of backside ILD layer 154. A suitable conductive metal can be any of the metals discussed above.

In illustrative embodiments, FIG. 15B shows lower portion VBPR 134 and upper portion VBPR 149 connected to backside power rail 156 and disposed between gate stack layer 140. The lower portion VBPR 134 is separated from the gate stack layer 140 by the sidewall spacer 120 and the upper portion VBPR 149 is separated from the gate stack layer 140 by the gate sidewall spacer 136. The lower portion VBPR 134 and upper portion VBPR 149 connect backside power rail 156 with frontside BEOL interconnect 150.

In illustrative embodiments, FIG. 15C shows backside power rail 156 being connected to the bottom source/drain regions 124 through the lower portion VBPR 134 and upper portion VBPR 149. The upper portion VBPR 149 includes a portion which is a frontside source/drain contact disposed on the bottom source/drain regions 124 and separated by contact liner 144. The upper portion VBPR 149 including the portion which is a frontside source/drain contact comprises a dual damascene metal structure. A portion of gate sidewall spacer 136 is disposed on upper portion VBPR 149.

Backside power delivery network 158 is formed over the structure including backside power rails and is based on creation of a wiring scheme that is disposed on both sides of the device layer (front end of line structure).

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a source/drain region;
   a frontside source/drain contact disposed on the source/drain region;
   a via-to-backside power rail disposed on the frontside source/drain contact and on a portion of the source/drain region;
   a backside power rail connected to the via-to-backside power rail; and
   an adhesion layer separating the via-to-backside power rail and the frontside source/drain contact.

2. The semiconductor structure of claim 1, wherein the via-to-backside power rail comprises a lower portion located on the backside power rail and an upper portion located on the frontside source/drain contact.

3. The semiconductor structure of claim 2, wherein the upper portion of the via-to-backside power rail and the frontside source/drain contact comprise a dual damascene metal structure.

4. The semiconductor structure of claim 2, further comprising the adhesion layer disposed between the lower portion and the upper portion of the via-to-backside power rail.

5. The semiconductor structure of claim 4, wherein the adhesion layer is a metal adhesion layer.

6. The semiconductor structure of claim 4, further comprising a dielectric spacer disposed on a sidewall of the upper portion of the via-to-backside power rail.

7. The semiconductor structure of claim 1, further comprising a silicide layer disposed between the frontside source/drain contact and the source/drain region.

8. The semiconductor structure of claim 7, wherein the silicide layer is further disposed between a portion of an upper portion of the via-to-backside power rail and the source/drain region.

9. The semiconductor structure of claim 7, wherein the adhesion layer is disposed on the via-to-backside power rail.

10. The semiconductor structure of claim 1, wherein the backside power rail is disposed in a backside interlayer dielectric layer.

11. A semiconductor structure, comprising:
   a first gate structure;
   a second gate structure;
   a sidewall spacer disposed on a portion of sidewalls of the first gate structure and the second gate structure;
   a dielectric spacer disposed on the remaining portion of the sidewalls of the first gate structure and the second gate structure; and
   a via-to-backside power rail disposed between the first gate structure and the second gate structure, the via-to-backside power rail having a lower portion separated from the first gate structure and the second gate structure by the sidewall spacer and an upper portion separated from the first gate structure and the second gate structure by the dielectric spacer.

12. The semiconductor structure of claim 11, further comprising a backside power rail disposed on the via-to-backside power rail.

13. The semiconductor structure of claim 11, further comprising an adhesion layer disposed between the lower portion and the upper portion of the via-to-backside power rail.

14. The semiconductor structure of claim 13, wherein the adhesion layer is a metal adhesion layer.

15. The semiconductor structure of claim 11, wherein the dielectric spacer is aligned with the sidewall spacer.

16. A semiconductor structure, comprising:

a first source/drain region;

a second source/drain region;

a first frontside source/drain contact disposed on the first source/drain region;

a second frontside source/drain contact disposed on the second source/drain region;

a via-to-backside power rail disposed on the first frontside source/drain contact and on a portion of the first source/drain region;

a backside power rail connected to the via-to-backside power rail; and an adhesion layer separating the via-to-backside power rail and the first frontside source/drain contact.

17. The semiconductor structure of claim 16, wherein the via-to-backside power rail comprises a lower portion located on the backside power rail and an upper portion located on the first frontside source/drain contact.

18. The semiconductor structure of claim 17, wherein the upper portion of the via-to-backside power rail and the first frontside source/drain contact comprise a dual damascene metal structure.

19. The semiconductor structure of claim 16, further comprising a silicide layer disposed between each of the first frontside source/drain contact and the first source/drain region and the second frontside source/drain contact and the second source/drain region.

20. The semiconductor structure of claim 19, wherein the adhesion layer is disposed on the via-to-backside power rail.

\* \* \* \* \*